United States Patent
Hu et al.

(10) Patent No.: US 12,272,584 B2
(45) Date of Patent: Apr. 8, 2025

(54) DIE-BONDING MACHINE

(71) Applicant: SHENZHEN XINYICHANG TECHNOLOGY CO., LTD, Shenzhen (CN)

(72) Inventors: Xinrong Hu, Shenzhen (CN); Gang Huang, Shenzhen (CN); Guopeng Zeng, Shenzhen (CN); Chuxiong Yan, Shenzhen (CN)

(73) Assignee: SHENZHEN XINYICHANG TECHNOLOGY CO., LTD, Shenzhen (CN)

( * ) Notice: Subject to any disclaimer, the term of this patent is extended or adjusted under 35 U.S.C. 154(b) by 449 days.

(21) Appl. No.: 17/727,938

(22) Filed: Apr. 25, 2022

(65) Prior Publication Data
US 2023/0215756 A1 Jul. 6, 2023

(30) Foreign Application Priority Data

Dec. 31, 2021 (CN) .......................... 202111674090.9

(51) Int. Cl.
*H01L 21/68* (2006.01)
*H01L 21/67* (2006.01)

(52) U.S. Cl.
CPC ........ *H01L 21/68* (2013.01); *H01L 21/67132* (2013.01); *H01L 21/67144* (2013.01)

(58) Field of Classification Search
CPC .................. H01L 21/68; H01L 21/67144
See application file for complete search history.

(56) References Cited

U.S. PATENT DOCUMENTS

| | | | | |
|---|---|---|---|---|
| 5,997,235 A * | 12/1999 | Hofmeister | ....... | H01L 21/67748 |
| | | | | 414/217 |
| 6,176,668 B1 * | 1/2001 | Kurita | ............... | H01L 21/67748 |
| | | | | 414/217 |
| 2015/0332950 A1 * | 11/2015 | Mazzocco | ............. | H01L 21/683 |
| | | | | 901/30 |

FOREIGN PATENT DOCUMENTS

| | | | | |
|---|---|---|---|---|
| CN | 209912891 U | 1/2020 | | |
| CN | 210349783 U | 4/2020 | | |
| CN | 111370350 A | 7/2020 | | |
| CN | 112008702 A * | 12/2020 | ............. | B25J 11/00 |
| CN | 112234004 A | 1/2021 | | |
| CN | 214254356 U | 9/2021 | | |
| CN | 112928052 B | 10/2021 | | |

(Continued)

OTHER PUBLICATIONS

Machine translation JPH08162502A (Year: 1996).*
(Continued)

*Primary Examiner* — Jacob T Minskey
*Assistant Examiner* — Wayne K. Swier
(74) *Attorney, Agent, or Firm* — Brooks Kushman P.C.

(57) ABSTRACT

The application provides a die-bonding machine, including: a transferring unit used to support and transfer a substrate to a bonding position; a feeding unit used to position and supply the substrate to the transferring unit; a die supply unit used to support a die ring and supply dies to a die supply position; a die ring supply unit used to supply full die rings to the die supply unit and recover empty die rings in the die supply unit; a turret mechanism for transferring the dies in the die supply position to a die extraction position; a piercing mechanism for downwardly piercing a blue film of a die on the die supply position to push the die to the turret mechanism; and, and a die-bonding mechanism.

8 Claims, 23 Drawing Sheets

(56) References Cited

FOREIGN PATENT DOCUMENTS

| | | | |
|---|---|---|---|
| JP | H08162502 | A | 6/1996 |
| JP | 2012175037 | A | 9/2012 |
| JP | 2015026750 | A | 2/2015 |
| JP | 2019204832 | A | 11/2019 |
| JP | 2020057750 | A | 4/2020 |
| KR | 1284745 | B1 * | 7/2013 |
| KR | 20170056415 | A | 5/2017 |
| TW | 200904592 | A | 2/2009 |
| TW | 201215554 | A | 4/2012 |
| TW | 202111766 | A | 3/2021 |
| TW | I732547 | B | 7/2021 |
| TW | I-1732547 | B * | 11/2021 |
| WO | 2019196755 | A1 | 10/2019 |

OTHER PUBLICATIONS

Machine translation CN210349783U (Year: 2020).*
Machine translation CN112008702A (Year: 2020).*
Machine translation KR101284745B1 (Year: 2013).*
Machine translation TWI732547B (Year: 2021).*
Machine translation CN112928052A (Year: 2021).*

* cited by examiner

DIE-BONDING MACHINE

CROSS-REFERENCE TO RELATED APPLICATIONS

This application claims priority to Chinese Patent Application No. 202111674090.9 filed on Dec. 31, 2021, the contents of which are incorporated herein by reference in their entirety.

BACKGROUND

Technical Field

The present application relates to the technical field of die bonding, and more specifically, relates to a die-bonding machine.

DESCRIPTION OF RELATED ART

For die bonding, the die on the wafer is generally sucked from the die supply position through the die-bonding swing arm, and then moved to the bonding position on the substrate to precisely mount the die on the substrate to achieve die bonding. The wafer is generally installed in a die ring, and the wafer is supported by the die ring. After the die on the wafer is taken out, an empty die ring is formed. For convenience of description, the die ring in which the wafers are stored is called a full die ring. The die has a front side and a back side, the back side of the die is generally provided with electrodes to connect with the substrate, and the front side of the die on the wafer is attached to the blue film. The current die-bonding machine generally uses the die taking mechanism to take out the die ring from the die ring box and place it in the die supply mechanism. The ejector mechanism pushes up the blue film on the wafer in the die supply mechanism to expand the blue film so that the adjacent dies are separated on the blue film, and then the dies are sucked from the top and are placed in the flipping mechanism to flip the die. And then the bonding head sucks the die from the flipping mechanism, and then installs the dies on the substrate. In this structure, the die needs to be flipped, and the moving distance of the bonding head is long, the moving distance of the die is long, and the efficiency is low.

SUMMARY

The purpose of the embodiments of the present application is to provide a die-bonding machine to solve the problems in the related art that the die-bonding machine needs to flip the die, and the die bonding head moves a long distance, the die moves a long stroke, and the efficiency is low.

In order to achieve the above purpose, the technical solution adopted in the embodiments of the present application is to provide a die-bonding machine. The die-boding machine includes: a transferring unit used to support and transfer a substrate to a bonding position;
a feeding unit used to position and supply the substrate to the transferring unit;
a die supply unit used to support a die ring and supply dies to a die supply position;
a die ring supply unit used to supply full die rings to the die supply unit and recover empty die rings in the die supply unit;
a turret mechanism for transferring the dies in the die supply position to a die extraction position;
a piercing mechanism for downwardly piercing a blue film of a die on the die supply position to push the die to the turret mechanism; and,
a die-bonding mechanism for sucking the die from the die extraction position and moving the die to the bonding position to be installed on the substrate.

The turret mechanism is arranged between the piercing mechanism and the die-bonding mechanism, the piercing mechanism is arranged on one side of the die supply unit, the transferring unit is arranged on one side of the feeding unit, and the feeding unit is located underneath the die-bonding mechanism.

Advantages of the die-bonding machine provided by the embodiments of the present application are summarized as follows: compared with the existing related art, the die-bonding machine of the embodiments of the present application automatically supplies the substrate to the feeding unit through a transferring unit, and drives the die on the substrate through the feeding unit. The mounting positions reach the die supply position in turn; the die ring supply unit is provided to automatically supply the full die ring and recycle the empty die ring, the die supply unit is arranged to provide the die to the die supply position, the piercing mechanism is arranged to pierce the blue film downward, to peel the die at the die supply position from the blue film so that the turret mechanism can receive the die, which can avoid the failure of die extraction; the turret mechanism transfers the die from the die supply position to the die extraction position, so that the die-bonding mechanism can directly suck from the turret mechanism. The die can be moved to the bonding position and installed on the substrate without flipping the die, and the stroke and time of the die-bonding mechanism to move the die can be shortened, thereby improving the smoothness of the die movement, and improving the die bonding accuracy and die bonding efficiency.

BRIEF DESCRIPTION OF THE DRAWINGS

In order to illustrate the technical solutions in the embodiments of the present application more clearly, the following briefly introduces the accompanying drawings that are used in the description of the embodiments or exemplary technologies. Obviously, the drawings in the following description are only for the present application. In some embodiments, for those of ordinary skill in the art, other drawings can also be obtained according to these drawings without any creative effort.

Figure 1:
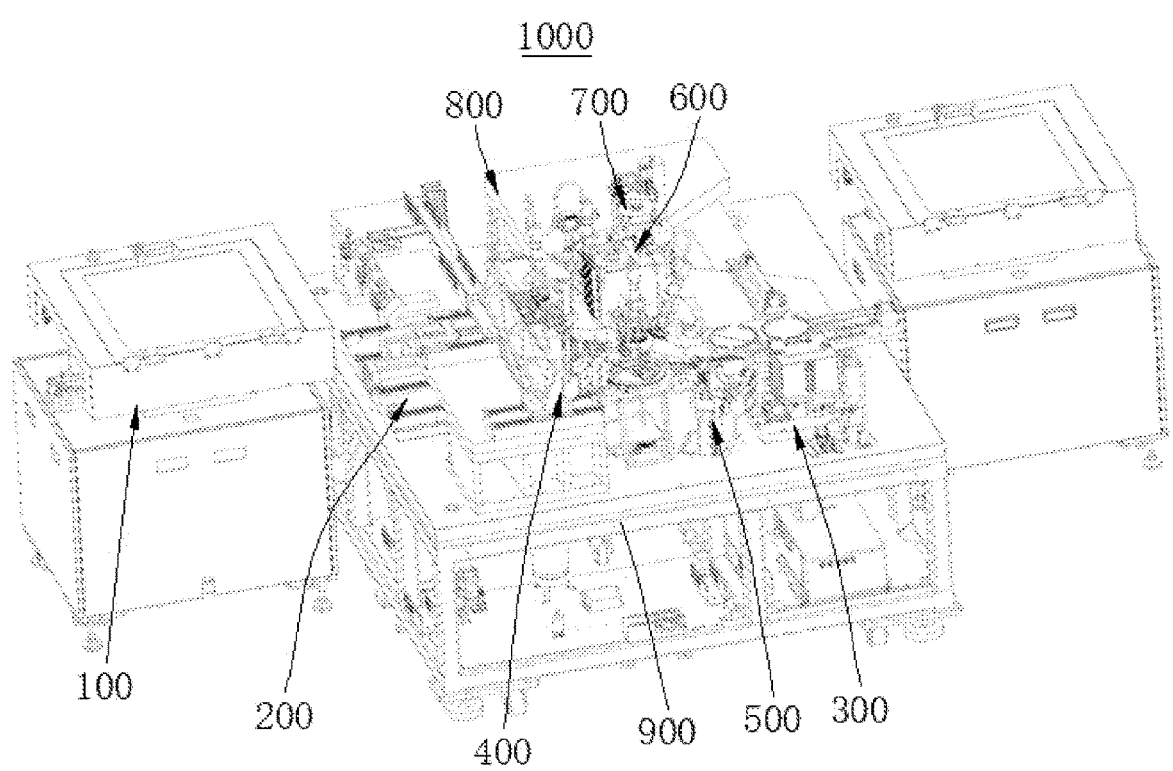
FIG. 1 is a schematic structural diagram of a die-bonding machine provided by an embodiment of the present application.

Among them, the main symbols of each accompanying drawing in the figures are as follows:

1000-die-bonding machine;

100-feeding unit; 11-installation table; 12-loading moving unit; 121-support table; 1211-guide groove; 122-belt transfer module; 1221-positioning baffle; 1222-rotating wheel; 1223-guide wheel; 1224-conveyor belt; 1225-transmission motor; 1226-anchoring wheel; 1227-adjusting plate; 1228-supporting wheel; 1229-position plate; 123-position mechanism; 1231-position block; 1232-lift driver; 1233-vertical slide; 124-fixed frame; 13-pushing mechanism; 131-pushing block; 1311-pushing seat; 132-pushing slide; 133-guide rail; 134-supporting plate; 135-main driving wheel; 136-slave driving wheel; 137-moving belt; 138-advancing motor; 139-clamping block.

200-a transferring unit; 210-splint mechanism; 211-support base plate; 2111-chutes; 212-roller assemblies; 2121-roller support; 21211-roller seats; 2122-roller; 2123-position seat; 2124-lift traveler; 2125-rail assembly; 213-clamping assemblies; 2131-pressing plate; 2132-clamping support; 2133-guide baffle; 2134-lift straightener; 214-supporting board; 2141-adsorption hole; 215-position assembly; 2151-block; 2152-lifter; 2153-vertical slide; 2154-sliding rail; 2155-mounting bracket; 220-plane movement platform; 221-vertical movement module; 2211-vertical bottom plate; 22111-vertical slot; 2212-vertical rail; 2213-vertical slider; 2214-vertical drive assembly; 22141-vertical screw; 22142-vertical nut; 22143-swivel support; 22144-vertical drive motor; 22145-vertical coupling; 222-traverse module; 2221-transverse base plate; 22211-transverse slot; 2222-transverse rail; 2223-transverse slider; 2224-transverse drive assembly; 22241-transverse screw; 22242-transverse nut; 22243-rotation support; 22244-transverse drive motor; 22245-transverse coupling.

300-die ring supply unit; 310-feeding mechanism; 311-position pallet; 312-lifting slide plate; 313-linear advancing module; 314-fixing seat; 315-sliding block; 316-vertical guide rail; 320-reclaiming mechanism; 321-reclaiming support; 322-sliding guide rail; 323-slider block; 324-sliding push plate; 325-linear push module; 326-moving clamp; 327-clamping driver; 328-connecting support plate; 330-delivery platform; 331-tray; 3311-accommodating slot; 332-linear driving module; 3321-loading base plate; 3322-loading guide rail; 3323-loading slider; 3324-loading clamp; 3325-loading belt; 3326-loading drive motor; 3327-main drive wheel; 3328-slave drive wheel; 340-delivery mechanism; 341-grab assembly; 3411-suction cup; 3412-support plate; 342-connecting frame; 343-lifting seat; 344-lift drive module; 345-mounting slide; 346-linear travel module; 347-travel support; 348-sensor.

400-die supply unit; 410-die frame rotation mechanism; 411-rotating die frame; 4111-external teeth; 412-supporting plate; 4121-opening; 413-rotary drive module; 4131-rotating wheel; 4132-rotating drive motor; 4133-supporting seat; 4134-tensioner; 4135-wheel seat; 420-moving platform; 421-lifting mechanism; 4211-lifting plate; 4212-connecting plate; 4213-lifting slider; 4214-vertical rail; 4215-lifting support; 4216-linear drive module; 422-traverse mechanism; 4221-traverse support; 42211-groove; 4222-transverse rail; 4223-transverse slider; 4224-linear push module; 423-vertical mechanism; 4231-vertical bracket; 4232-vertical rail; 4233-vertical slider; 4234-vertical sliding plate; 4235-linear advancing module.

500-piercing mechanism; 511-ejector pin; 512-needle seat; 513-supporting arm; 5131-weight reduction through hole; 514-lift pusher; 515-installation support; 516-lifting rail; 517-slide seat; 518-elastic part; 520-plane moving module; 521-first moving module; 5211-first sliding seat; 5212-first connecting rod; 52121-first vertical groove; 5213-first guide rail; 5214-first moving assembly; 52141-first driving motor; 52142-first eccentric wheel; 522-second moving module; 5221-connecting seat; 5222-second sliding seat; 5223-second guide rail; 5224-second connecting rod; 52241-second vertical groove; 5225-second moving assembly; 52251-second driving motor; 52252-second eccentric wheel; 530-lifting module; 531-adjusting seat; 532-installation seat; 533-linear driver.

600-turret mechanism; 61-die holder; 611-suction head; 6111-suction hole; 612-suction seat; 613-suction connector; 62-transfer module; 621-turn turret arm; 6211-weight reduction hole; 622-rotating base; 623-rotary driver; 624-radiator; 625-positioning bracket.

700-die-bonding mechanism; 71-suction nozzle; 72-die-bonding swing arm; 721-weight reduction opening; 73-rotating seat; 74-die-bonding motor; 75-die-bonding bracket; 76-vertical rail; 77-lifting pusher; 78-adjustment component; 781-driving pulley; 782-driven pulley; 783-synchronous belt; 784-rotating motor; 79-radiator member.

800-frame; 81-installation plate; 82-adjustment mechanism; 821-sliding plate; 822-lifting driver; 823-transverse pusher; 824-supporting frame. 900-stand; 91-die supply camera unit; 911-die supply camera module; 912-lift driver; 913-vertical shift adjuster; 914-vertical shift support plate; 92-die extraction camera module; 93-transfer camera module; 94-die camera module; 95-detection camera module; 96-die ring box; 97-die ring; 971-full die ring; and 972-empty die ring.

DETAILED DESCRIPTION

In order to make the technical problems, technical solutions and beneficial effects to be solved by the present application clearer, the present application will be described in further detail below with reference to the accompanying drawings and embodiments. It should be understood that the specific embodiments described herein are only used to explain the present application, but not to limit the present application.

It should be noted that when an element is referred to as being "fixed to" or "arranged on" another element, it can be directly on the other element or indirectly on the other element. When an element is referred to as being "connected to" another element, it can be directly connected to the other element or indirectly connected to the other element.

In addition, the terms "first" and "second" are only used for descriptive purposes, and should not be construed as indicating or implying relative importance or implying the number of indicated technical features. Thus, a feature defined as "first" or "second" may expressly or implicitly include one or more of that feature. In the description of the present application, "a plurality of" means two or more, unless otherwise expressly and specifically defined. "Several" means one or more than one, unless expressly specifically defined otherwise.

In the description of this application, it should be understood that the terms "center", "length", "width", "thickness", "upper", "lower", "front", "rear", "left", "The orientation or positional relationship indicated by "right", "vertical", "horizontal", "top", "bottom", "inside", "outside", etc. is based on the orientation or positional relationship shown in the drawings, and is only for convenience Describe the application and simplify the description without indicating or implying that the referred device or element must have a particular orientation, be constructed and operate in a particular orientation, and therefore should not be construed as limiting the application.

In the description of this application, it should be noted that, unless otherwise expressly specified and limited, the terms "installed", "connected" and "connecting" should be understood in a broad sense, for example, it may be a fixed connection or a detachable connection, or integral connection; may be mechanical connection or electrical connection; may be direct connection or indirect connection through an intermediate medium, may be internal communication between two elements or an interaction relationship between two elements. For those of ordinary skill in the art, the specific meanings of the above terms in this application can be understood according to specific situations.

Reference in this specification to "one embodiment," "some embodiments," or "an embodiment" means that a particular feature, structure, or characteristic described in connection with the embodiment is included in one or more embodiments of the application. Thus, appearances of the phrases "in one embodiment," "in some embodiments," "in other embodiments," "in other embodiments," etc. in various places in this specification are not necessarily all refer to the same embodiment, but mean "one or more but not all embodiments" unless specifically emphasized otherwise.

Furthermore, the particular features, structures or characteristics may be combined in any suitable manner in one or more embodiments.

For the convenience of description, the three coordinate axes that are perpendicular to each other in space are defined as the X axis, the Y axis and the Z axis. Among them, the X axis and the Y axis are two coordinate axes that are perpendicular to each other on the same horizontal plane, and the Z axis is the coordinate axis in the vertical direction; the X axis, the Y axis and the Z axis are located in the space perpendicular to each other, and there are three planes, namely the XY plane and the YZ plane. and the XZ plane, the XY plane is a horizontal plane, the XZ plane and the YZ plane are both vertical planes, and the XZ plane is perpendicular to the YZ plane. The three axes in space are the X, Y and Z axes. Moving along the three axes in space refers to moving along the three mutually perpendicular axes in space, especially moving along the X, Y and Z axes in space; while the plane moves, then it moves on the XY plane.

Figure 2:
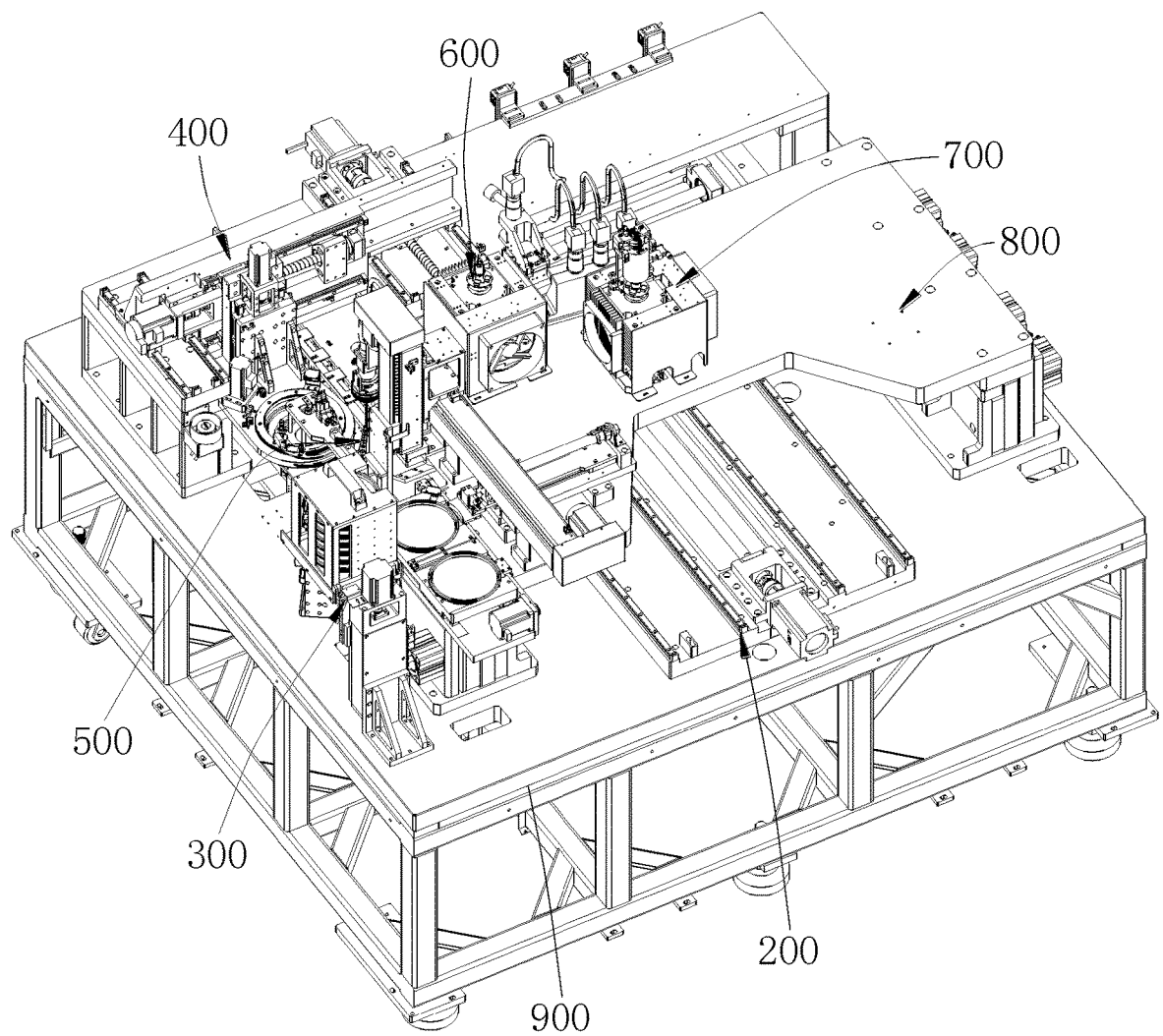
FIG. 2 is a schematic diagram of a partial structure of a die-bonding machine provided by an embodiment of the present application.

Referring to FIG. 1 and FIG. 2, the die-bonding machine 1000 provided by the present application will now be described. The die-bonding machine 1000 includes a transferring unit 200, a feeding unit 100, a die supply unit 400, a die ring supply unit 300, a turtle mechanism 600, a piercing mechanism 500 and a die-bonding mechanism 700. The turret mechanism 600 is arranged between the piercing mechanism 500 and the die-bonding mechanism 700, the piercing mechanism 500 is arranged on one side of the die supply unit 400, a transferring unit 200 is arranged on one side of the feeding unit 100, and the feeding unit 100 is arranged below the die-bonding mechanism 700. A transferring unit 200 is used to support and transfer the substrate to the bonding position. The feeding unit 100 is used for positioning and supplying the substrate to a transferring unit 200. The die supply unit 400 is used to support the die ring 97 and supply the die to the die supply position. The die ring supply unit 300 is used for supplying the full die ring 971 to the die supply unit 400 and recycling the empty die ring 972 in the die supply unit 400. The turret mechanism 600 is used to transfer the die at the die supply position to the die extraction position. The piercing mechanism 500 pierces the blue film on the die on the die supply position downward to push the die to the turret mechanism 600. The die-bonding mechanism 700 is used to suck the die at the die extraction position and move it to the bonding position for mounting on the substrate.

When in use, the substrate is placed in the feeding unit 100, the feeding unit 100 transmits the substrate to a transferring unit 200, and the transferring unit 200 moves the substrate, so that the position where the die needs to be installed on the substrate goes to the bonding position in order for die bonding. The die ring supply unit 300 transfers the wafer-installed die ring 97 (ie, the full die ring 971) to the die supply unit 400, and collects the empty die ring 972 (the die ring 97 from which the die has been taken out) in the die supply unit 400. The die supply unit 400 transfers the dies in the die ring 97 to the die supply position in sequence, and the piercing mechanism 500 pierces the blue film on the die supply position to eject the die downward, so that the die falls to the turtle mechanism 600, and the turtle mechanism 600 pierces the die at the die supply position. Received and transferred to the die extraction position, the die-bonding mechanism 700 transfers the die from the suction turret mechanism 600 to the die extraction position and moves to the bonding position to mount the die on the substrate. Therefore, there is no need to flip the die, and through the transfer of the turret mechanism 600, the stroke of the die-bonding mechanism 700 to move the die can be shortened, and the stability, precision and efficiency of the die movement can be improved. Using the piercing mechanism 500 to pierce the blue film to peel off the die can ensure that the die is accurately placed on the turret mechanism 600, avoiding the problem of die extraction failure.

Compared with the prior art, the die-bonding machine 1000 provided by the embodiment of the present application, the die-bonding machine 1000 of the embodiment of the present application automatically supplies the substrate to the feeding unit 100 through the transferring unit 200, and drives the die installation positions on the substrate to arrive in sequence through the feeding unit 100. Arrange die ring supply unit 300 to automatically supply full die ring 971 and recycle empty die ring 972, arrange die supply unit 400 to supply die to die supply position, arrange piercing mechanism 500, pierce the blue film downward to pierce the die at the supply position is stripped from the blue film so that it can be received by the turret mechanism 600, which can avoid the failure of the extraction; the turret mechanism 600 transfers the die from the die supply position to the die extraction position, so that the die-bonding mechanism 700 can directly suck the die from the turret mechanism 600 to move until the bonding position is installed on the substrate, there is no need to flip the die, and the stroke and time for the die-bonding mechanism 700 to move the die can be shortened, thereby improving the smoothness of the die movement, and improving the die bonding accuracy and die bonding efficiency.

In one embodiment, die-bonding machine 1000 further includes a stand 900, a transferring unit 200, a die supply unit 400, a die ring supply unit 300, a turtle mechanism 600, a piercing mechanism 500 and a die-bonding mechanism 700 supported on the stand 900 to facilitate installation and use.

Figure 3:
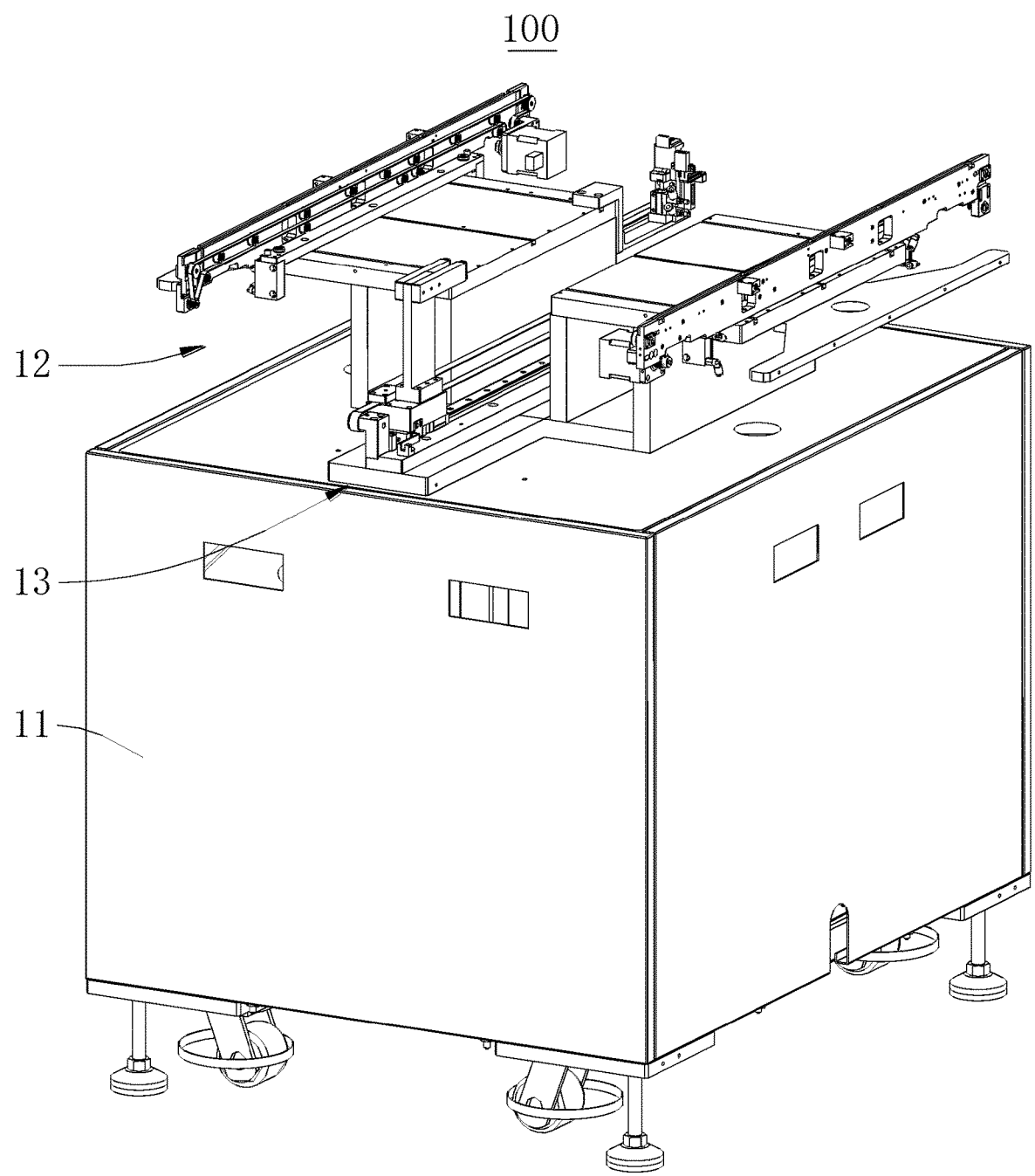
FIG. 3 is a schematic structural diagram of a feeding unit provided in an embodiment of the present application.
Figure 4:
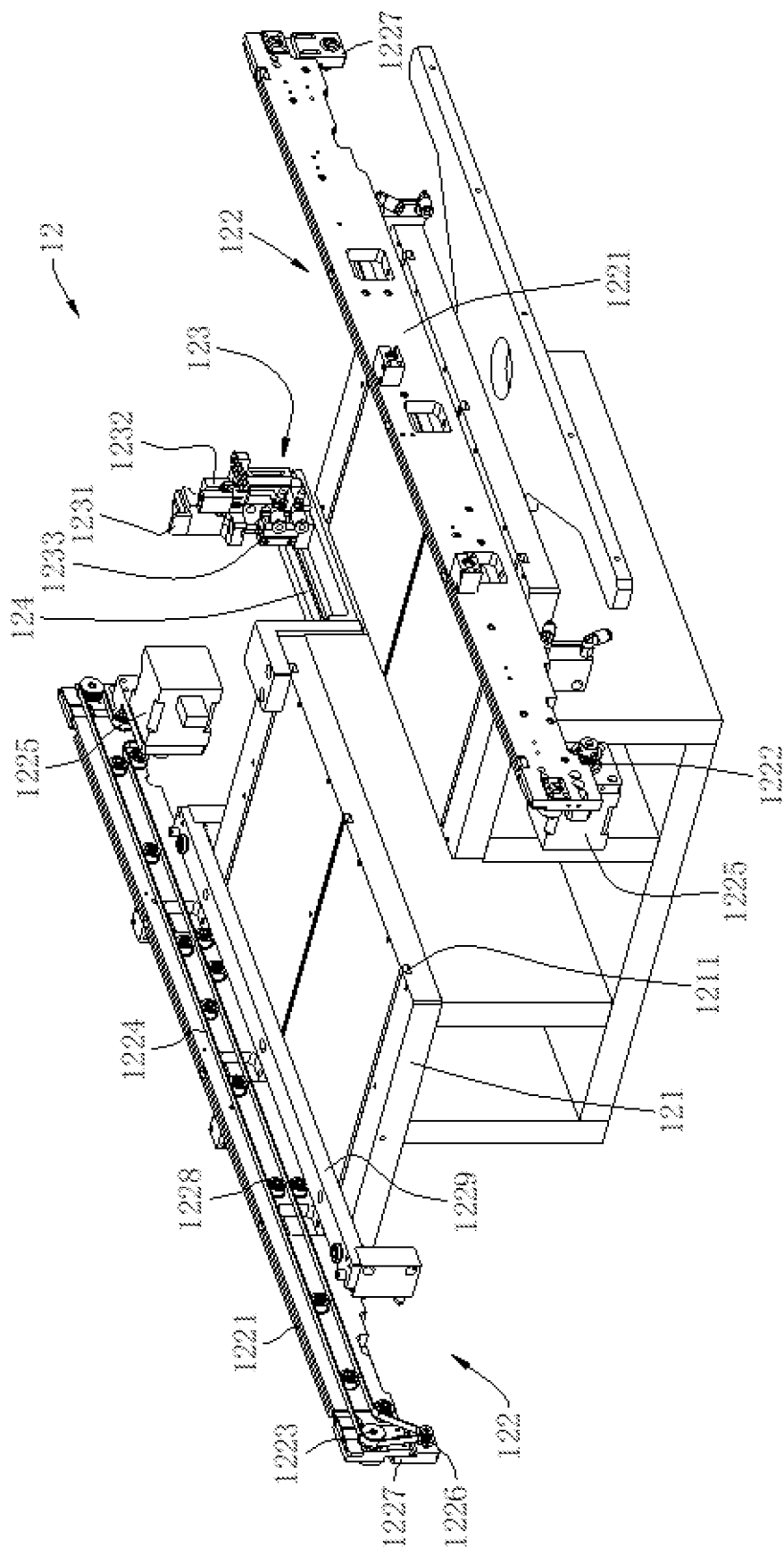
FIG. 4 is a schematic structural diagram of a loading moving unit provided by an embodiment of the present application.
Figure 5:
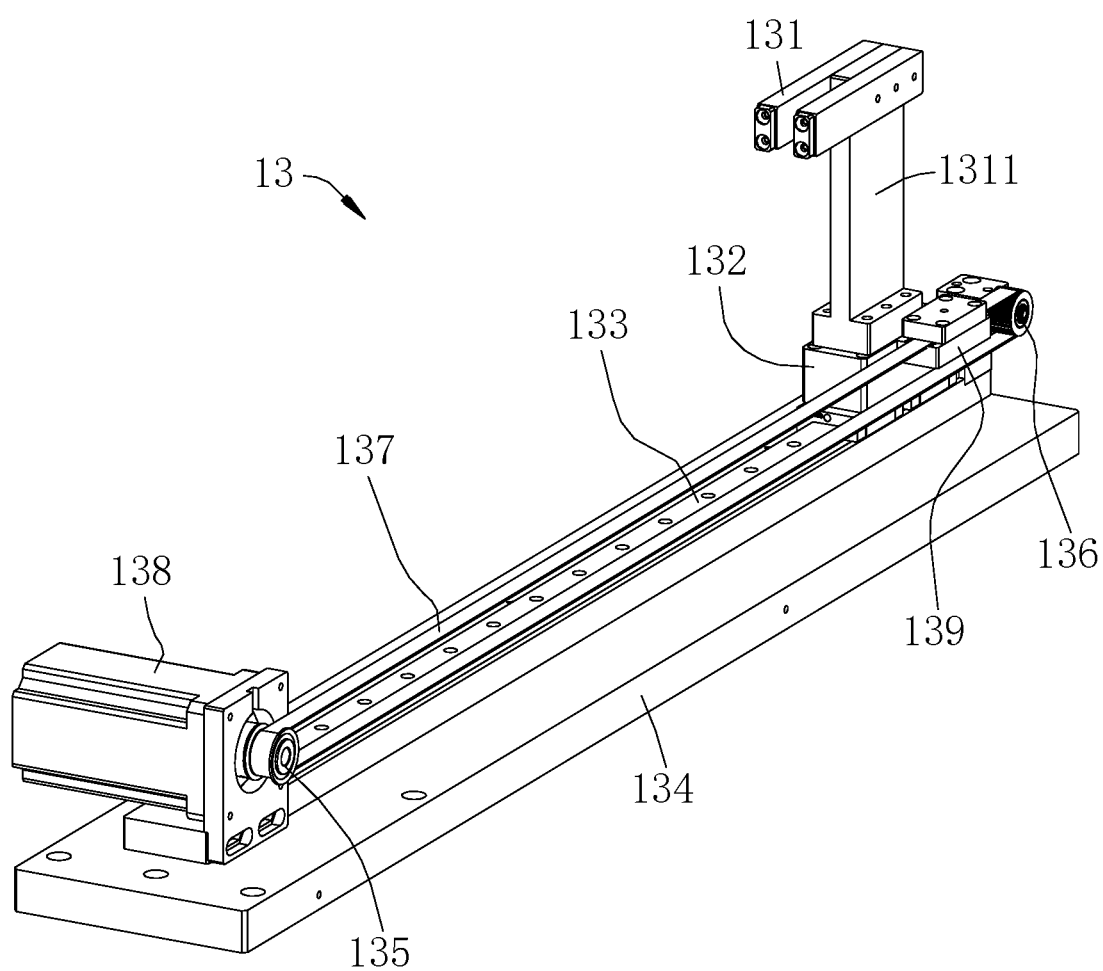
FIG. 5 is a schematic structural diagram of a pushing mechanism provided by an embodiment of the present application.

In one embodiment, referring to FIG. 3 to FIG. 5, the feeding unit 100 includes an installation table 11, a loading moving unit 12 and a pushing mechanism 13. The loading moving unit 12 and the pushing mechanism 13 are installed on the installation table 11 for assembly. The loading moving unit 12 is used to locate the supporting substrate and transmit the positioned substrate, when the substrate is placed on the loading moving unit 12, the loading moving unit 12 will locate the supported substrate, and then transmit the substrate to the transferring unit 200 for precise transmission. The pushing mechanism 13 is used to push the substrate to the loading moving unit 12, that is, when the substrate is placed on the loading moving unit 12, or the substrate is supplied to the loading moving unit 12, the pushing mechanism 13 pushes the substrate to move on the loading moving unit 12, so as to move the substrate on the loading moving unit 12. The substrate is positioned, so that the loading moving unit 12 accurately transmits the substrate to ensure the accurate feeding of the substrate.

In one embodiment, referring to FIG. 3 and FIG. 4, the loading moving unit 12 includes two support tables 121, two belt transfer modules 122 and a position mechanism 123. The two support tables 121 are installed on both sides of the installation table 11 respectively, so that an installation space will be formed between the two support tables 121, so that the pushing mechanism 13 can be placed in the installation space, and it is convenient for the pushing mechanism 13 to push the belt transfer modules 122 supported on the two belt transfer modules 122. Two belt transfer modules 122 are installed on two support tables 121 respectively. When supporting the substrate, the two sides of the substrate are respectively supported on two belt transfer modules 122, so that the two belt transfer modules 122 cooperate to support the substrate; in addition, when feeding, the two belt transfer modules 122 operate to transmit the substrate. The position mechanism 123 is supported on the installation table 11, and the position mechanism 123 is provided at the discharge end of the belt transfer module 122. The position mechanism 123 is used to position the substrate stopper at the discharge end of the two belt transfer modules 122, when the substrate is placed on the two belt transfer modules 122, the pushing mechanism 13 pushes the substrate on the two belt transfer modules 122 to move to the position mechanism 123, and the position mechanism 123 stops the substrate, so as to realize the positioning of the substrate and the positioning is accurate.

In one embodiment, referring to FIG. 3 and FIG. 4, the position mechanism 123 includes a position block 1231 and a lift driver 1232, the lift driver 1232 is supported on the installation table 11, the position block 1231 is installed on the lift driver 1232, and the position block 1231 is pushed up and down by the lift driver 1232, thereby when the mechanism 13 pushes the substrate to move on the belt transfer module 122, the lift driver 1232 can push the position block 1231 up to stop the positioning of the substrate; and when the substrate needs to be sent out, the lift driver 1232 drives the position block 1231 down, so that the belt transfer module 122 sends the substrate out.

In one embodiment, the lift driver 1232 is an air cylinder with a simple structure and convenient installation. Understandably, the lift driver 1232 can also be a linear motor or the like.

In one embodiment, the position mechanism 123 further includes a vertical slide 1233, the vertical slide 1233 is arranged vertically, and the position block 1231 is slidably installed on the vertical slide 1233 to guide the position block 1231 to move up and down smoothly.

In one embodiment, the loading moving unit 12 further includes a fixed frame 124, the fixed frame 124 is installed on a support table 121, and the position mechanism 123 is installed on the fixed frame 124. The arrangement of the fixed frame 124 to facilitate installation of position mechanism 123.

In the above embodiment, the vertical slide 1233 is installed on the fixed frame 124. The lift driver 1232 is also installed on the fixed frame 124 for easy assembly.

In one embodiment, each belt transfer module 122 includes a positioning baffle 1221, a rotating wheel 1222, several guide wheels 1223, a conveyor belt 1224 and a transmission motor 1225. The positioning baffle 1221 is installed on the corresponding support table 121, and the positioning baffle 1221 is supported by the support table 121.

The rotating wheel 1222 is rotatably installed on the positioning baffle 1221; a plurality of guide wheels 1223 are rotatably installed on the positioning baffle 1221; the conveyor belt 1224 is connected to the rotating wheel 1222 and the guide wheels 1223; the transmission motor 1225 is installed on the positioning baffle 1221; the rotating wheel 1222 is connected to the transmission motor 1225. The transmission motor 1225 drives the rotating wheel 1222 to rotate, so as to drive the conveyor belt 1224 to rotate, so as to transmit the substrate. Several guide wheels 1223 are provided to support the conveyor belt 1224.

In one embodiment, each belt transfer module 122 further includes an anchoring wheel 1226 and an adjusting plate 1227, the anchoring wheel 1226 is installed on the adjusting plate 1227, and the anchoring wheel 1226 can rotate on the adjusting plate 1227, and the adjusting plate 1227 is installed on the positioning baffle 1221, so that the adjusting plate 1227 can be adjusted by adjusting the height position of the plate 1227, and then adjust the position of the anchoring wheel 1226 to tension the conveyor belt 1224.

Specifically, an elongated hole may be provided on the adjusting plate 1227, bolts may be used to pass through the elongated hole to be installed on the positioning baffle 1221, and the height of the adjusting plate 1227 may be adjusted by loosening the bolts. It can be understood that the adjusting plate 1227 can also be slidably installed on the positioning baffle 1221, and a pressing spring can be installed on the positioning baffle 1221 to press against the adjusting plate 1227, so that the anchoring wheel 1226 on the adjusting plate 1227 can press against the conveyor belt 1224.

In one embodiment, each belt transfer module 122 further includes a plurality of supporting wheels 1228, each supporting wheel 1228 is rotatably installed on the positioning baffle 1221, and the supporting wheels 1228 are used to support the conveyor belt 1224, so as to prevent the middle of the conveyor belt 1224 from sinking and bending, so as to transmit the substrate smoothly and accurately. It can be understood that a brace can also be provided to support the conveyor belt 1224, so as to avoid the middle of the conveyor belt 1224 from sinking and bending, so as to support the substrate stably.

In one embodiment, each belt transfer module 122 further includes a position plate 1229, the position plate 1229 is slidably installed on the support table 121, the positioning baffle 1221 is installed on the position plate 1229, and each support table 121 is provided with a guide groove 1211 for guiding the movement of the position plate 1229. The conveying direction of the conveyor belt 1224 is extended, and the position plate 1229 is arranged to lock the positioning baffle 1221 on the support table 121, which is convenient for fixing the positioning baffle 1221 and then the belt transfer module 122. The guide groove 1211 is arranged on the support table 121, the guide plate can be connected to the guide groove 1211, so that the position plate 1229 can be guided to move, and then the positioning baffle 1221 can be moved to adjust the distance between the two positioning baffles 1221, and then adjust the distance between the two belt transfer modules 122. The distance between them, and then adapt to the substrate of different widths, improve the adaptability. In addition, the guide groove 1211 is arranged on the support table 121, and the position plate 1229 is slidably connected to the guide groove 1211, so that the height can be lowered, and the center of gravity of the substrate can be arranged lower to move the substrate smoothly. It can be understood that a track can also be provided on the support table 121, and the position plate 1229 can be slidably installed on the track, so as to guide the movement of the position plate 1229 through the track.

In one embodiment, a plurality of guide grooves 1211 are provided on the support table 121, and the plurality of guide grooves 1211 are arranged in parallel and spaced apart to guide the movement of the position plate 1229 more smoothly.

In one embodiment, referring to FIGS. 4 and 5, the pushing mechanism 13 includes a pushing block 131, a supporting plate 134, a guide rail 133, a pushing slide 132, an advancing motor 138, a main driving wheel 135, a slave driving wheel 136, a moving belt 137 and a clamping block 139, the pushing block 131 is used for pushing the substrate. The pushing block 131 is arranged to push the substrate, so as to protect the substrate, and it can be easily replaced and repaired, and the substrate can be pushed more accurately to position the substrate. The supporting plate 134 is installed on the installation table 11 to support the supporting plate 134 by the installation table 11. The guide rail 133 is installed on the supporting plate 134 to support the guide rail 133 by the supporting plate 134. The guide rail 133 is extended on the supporting plate 134 along the conveying direction of the loading moving unit 12. The pushing slide 132 is slidably installed on the guide rail 133, and the pushing block 131 is installed on the pushing slide 132 to support the pushing block 131 by the pushing slide 132. The guide rail 133 is used to guide the pushing slide 132 to move, and then guide the pushing block 131 to move. The advancing motor 138 is installed on the supporting plate 134, the main driving wheel 135 is connected to the pushing motor, so that the main driving wheel 135 is rotatably supported on the supporting plate 134, the slave driving wheel 136 is rotatably supported on the supporting plate 134, and the moving belt 137 connects the main driving wheel 135 and the slave driving wheel 136, the clamping block 139 is fixedly connected to the moving belt 137, and the pushing slide 132 is connected to the clamping block 139, so that when the motor drives the main driving wheel 135 to rotate, the moving belt 137 can be driven to move, and then the pushing slide 132 and the pushing block 131 are moved linearly through the clamping block 139, so as to push the substrate. The pushing mechanism 13 is simple in structure, convenient in assembly and low in cost. It can be understood that the pushing mechanism 13 can also use a linear mechanism such as a screw-nut mechanism, a rack-and-pinion mechanism, or the like.

In one embodiment, the pushing mechanism 13 further includes a pushing seat 1311, the pushing seat 1311 is installed on the pushing slide 132, and the pushing block 131 is installed on the pushing seat 1311, so as to adjust the height of the pushing block 131 to facilitate assembly and debugging.

Figure 6:
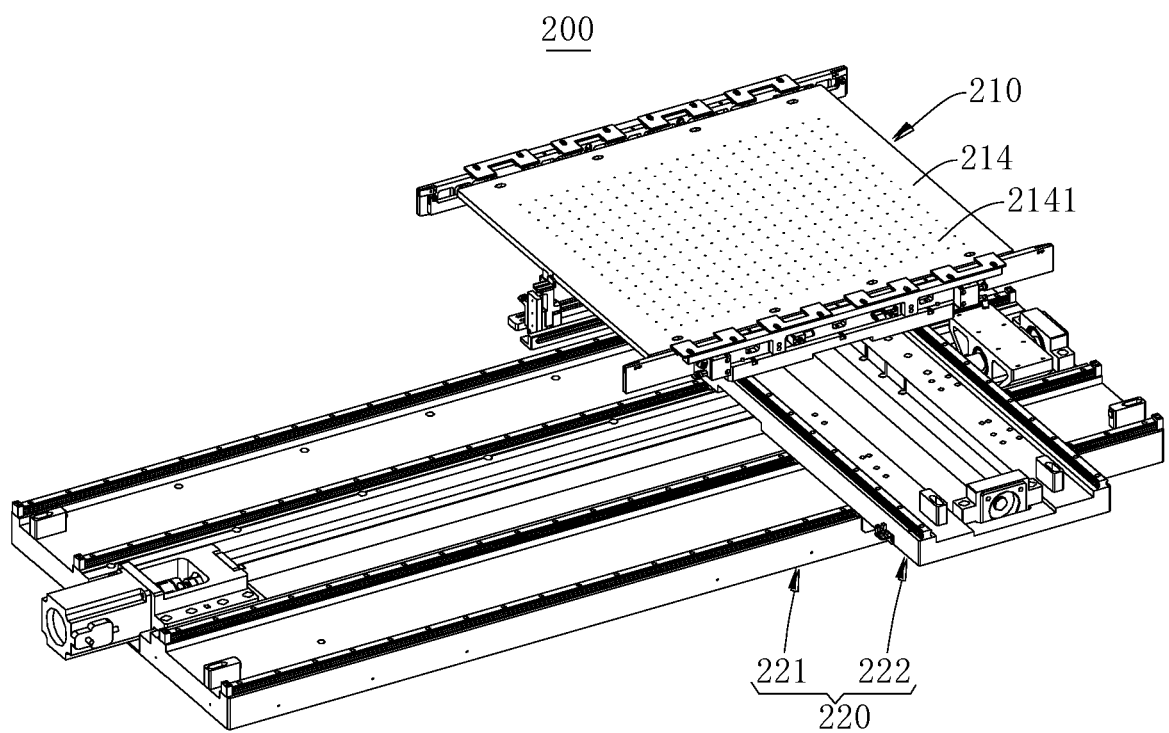
FIG. 6 is a structural representation of a transferring unit provided by the embodiment of the present application.
Figure 7:
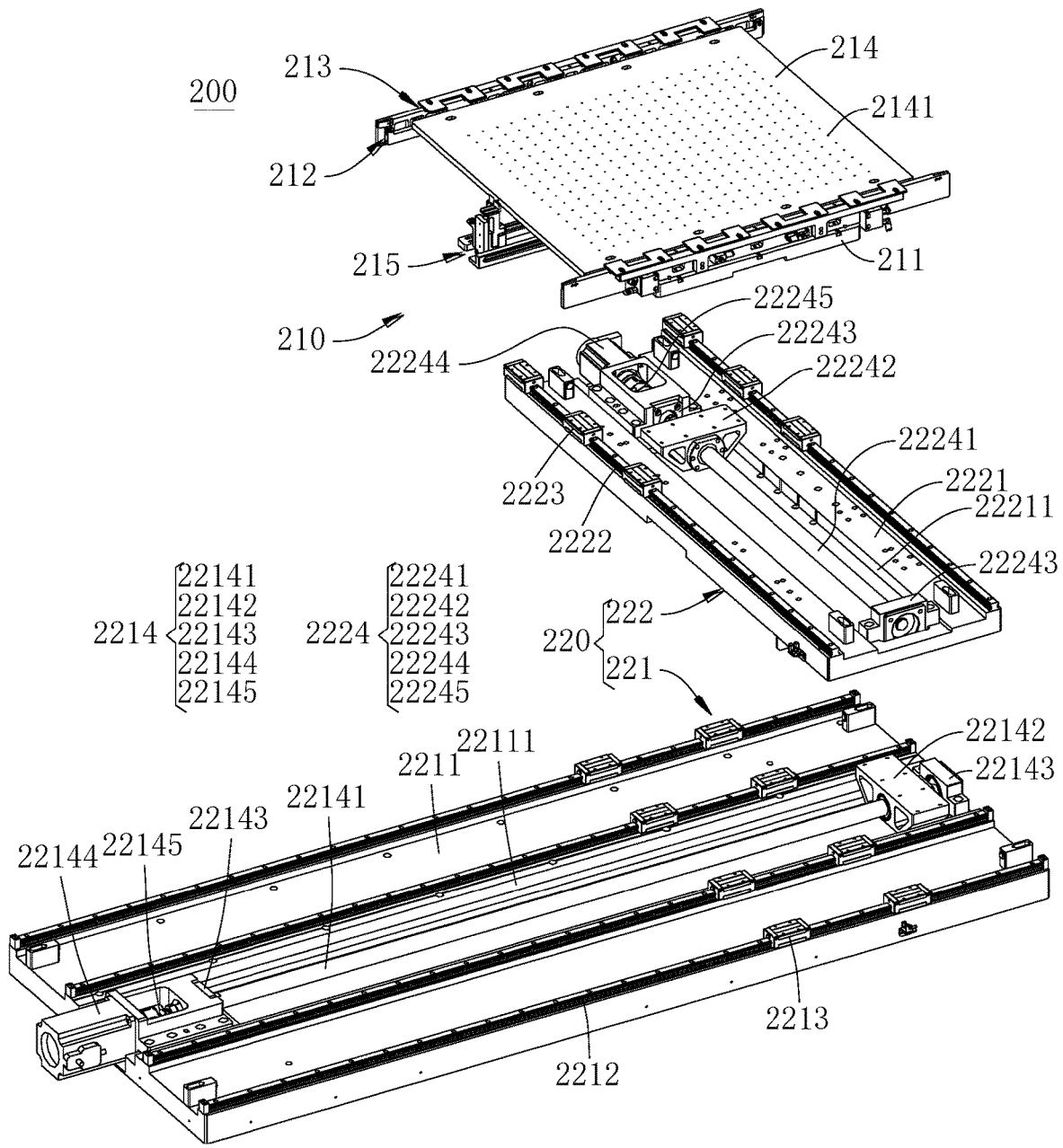
FIG. 7 is a schematic diagram of an explosive structure of a transferring unit provided in the embodiment of the present application.
Figure 8:
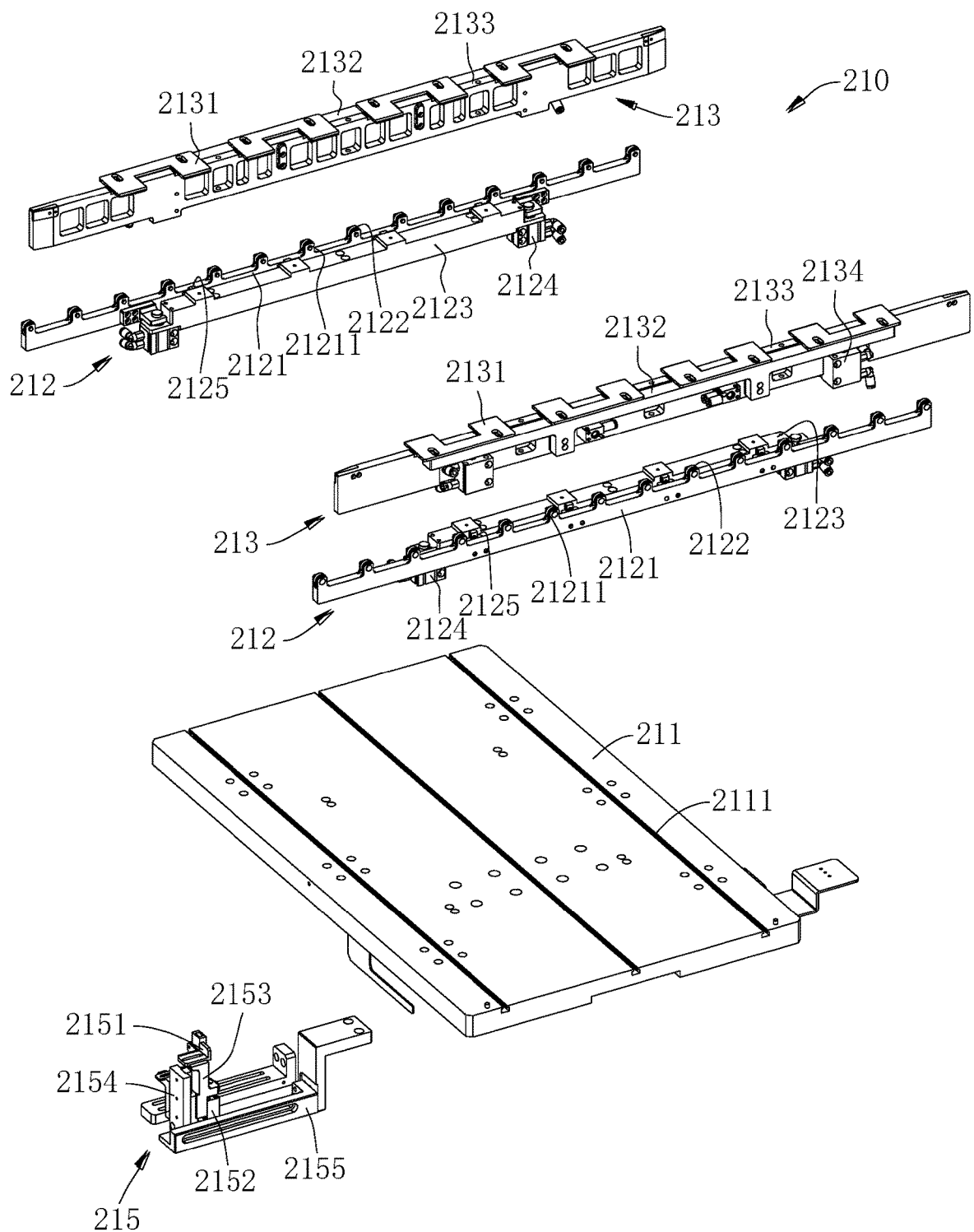
FIG. 8 is a schematic diagram of an exploded structure of a splint mechanism provided by an embodiment of the present application.

In one embodiment, referring to FIG. 6 to FIG. 8, the transferring unit 200 includes a splint mechanism 210 and a plane movement platform 220. The splint mechanism 210 is installed on the plane movement platform 220, and the plane movement platform 220 drives the splint mechanism 210 to move on the plane, thereby driving the substrate to move. The splint mechanism 210 includes a support base plate 211, two sets of roller assemblies 212 and two sets of clamping assemblies 213. Among them, two sets of roller assemblies 212 are installed on opposite sides of support base plate 211 respectively, two sets of clamping assemblies 213 are in one-to-one correspondence with two sets of roller assemblies 212, and two sets of clamping assemblies 213 are installed on opposite sides of support base plate 211 respectively. Two sets of roller assemblies 212 are used to fit opposite sides of the support substrate. Two sets of clamping assemblies 213 are used to press and fix opposite sides of the substrate on the corresponding roller assemblies 212, so that each clamping assemblies 213 and the corresponding roller assemblies 212 cooperate to clamp and fix the sides of the substrate. The support base plate 211 is installed on the plane movement platform 220, and the splint mechanism 210 is installed on the plane movement platform 220.

When in use, the substrate is transferred to the splint mechanism 210, and the opposite sides of the substrate are respectively supported on two sets of roller assemblies 212. The two sets of clamping assemblies 213 press the two sides of the substrate against the corresponding roller assemblies 212 to clamp and fix the substrate, so that the plane movement platform 220 drives the splint mechanism 210 to drive the substrate to move on the plane. Since roller assemblies 212 are used to support the substrate, the height of the substrate relative to the support base plate 211 can be arranged lower to reduce the center of gravity of the substrate, and clamping assemblies 213 and roller assemblies 212 are used to clamp and fix the substrate, which is lighter in weight and more simplified in structure. Lightweight, the plane movement platform 220 can drive the substrate to move more smoothly and accurately, which is convenient for the rapid movement and positioning of the substrate.

In one embodiment, referring to FIGS. 6 to 8, the roller assemblies 212 include a roller support 2121 and a plurality of rollers 2122, the plurality of rollers 2122 are respectively installed on the roller support 2121, and the roller support 2121 is provided with a plurality of roller seats 21211 to support the roller 2122, and the rollers support 2121 is supported on the support base plate 211, and further supports the plurality of rollers 2122 on the support base plate 211. A plurality of roller seats 21211 are arranged with gaps along the length direction of the roller support 2121, and each roller seat 21211 is rotatably installed with a roller 2122, so that the plurality of roller seats 2122 are arranged on the roller support 2121 in a row to better support the sides of the substrate. The roller seats 21211 are arranged on the roller support 2121 to support the roller 2122, the structure is simple and the assembly is convenient, and the roller support 2121 is installed on the support base plate 211, that is, multiple rollers 2122 can be supported on the support base plate 211, and the installation is convenient.

In one embodiment, the roller assemblies 212 further include a position seat 2123, a plurality of rail assemblies 2125, and a lift traveler 2124. Each rail assembly 2125 is connected to the position seat 2123 and the roller support 2121. The rail assembly 2125 is used to guide the roller support 2121 to move up and down on the position seat 2123, and a plurality of rail assemblies 2125 are provided to guide the roller support 2121 to move up and down on the position seat 2123 more smoothly. The lift traveler 2124 is installed on the position seat 2123, and the lift traveler 2124 is used to push the roller support 2121 to move up and down. The position seat 2123 is installed on the support base plate 211. The position seat 2123 is driven to move up and down by the lift traveler 2124, which in turn can drive each roller 2122 to move up and down, so as to cooperate with the clamping assemblies 213 to clamp the substrate to ensure that the substrate is more stable.

In one embodiment, the lift traveler 2124 is an air cylinder, which is small in size, light in weight and easy to control. Understandably, the lift traveler 2124 can also be a linear module such as a linear motor.

In one embodiment, there are a plurality of lift travelers 2124 to match the lifting and lowering of the roller support 2121, so that the lift traveler 2124 with a smaller volume can be used to reduce the thickness of the splint mechanism 210, thereby reducing the height of the substrate, so as to reduce the height of the center of gravity of the substrate.

In one embodiment, rail assembly 2125 may be a lifting rail 516 slider assembly. It can be understood that, the rail assembly 2125 may also be a cross rail or the like.

In one embodiment, the position seat 2123 is slidably installed on the support base plate 211, and a plurality of chutes 2111 are opened on the support base plate 211. The chutes 2111 are used to guide the position seat 2123 to move on the support base plate 211. The position of the position seat 2123 on the support base plate 211 can be adjusted, and then the distance between the two roller assemblies 212 can be adjusted to accommodate substrates of different sizes.

In one embodiment, clamping assemblies 213 include pressing plate 2131, clamping support 2132 and lift straightener 2134. The pressing plate 2131 is used to press the substrate against the corresponding roller assemblies 212. The clamping support 2132 supports the pressing plate 2131, that is, the pressing plate 2131 is installed on the clamping support 2132, and the pressing plate 2131 is supported by the clamping support 2132. The lift straightener 2134 is supported on the support base plate 211. The lift straightener 2134 drives the clamping support 2132 to move up and down to drive the pressing plate 2131 to move up and down, so that the lift straightener 2134 drives the pressing plate 2131 to rise to leave the corresponding roller assemblies 212, the substrate can be supplied to the roller assemblies 212, or the substrate on the roller assemblies 212 can be taken out; After the substrate is supplied on the assemblies 212, the lift straightener 2134 drives the pressing plate 2131 down to press the side of the substrate against the corresponding roller assemblies 212 to fix the substrate.

In one embodiment, the lift straightener 2134 is an air cylinder, which is small in size, light in weight and easy to control. Understandably, the lift straightener 2134 can also be a linear module such as a linear motor.

In one embodiment, there are multiple lift straighteners 2134 to match the lift of the roller support 2121, so that the lift straightener 2134 with a smaller volume can be used to reduce the thickness of the splint mechanism 210, thereby reducing the height of the substrate, so as to reduce the height of the center of gravity of the substrate.

In one embodiment, there are a plurality of pressing plates 2131, and the plurality of pressing plates 2131 are arranged at intervals so as to press against the substrate. By arranging a plurality of pressing plates 2131, each pressing plate 2131 can be made smaller, reducing weight and covering a larger area.

In one embodiment, each pressing plate 2131 is arranged in a U shape for easy installation and fixation.

In one embodiment, the clamping assemblies 213 further include a guide baffle 2133, which is installed on the support base plate 211, the clamping support 2132 is slidably supported on the guide baffle 2133, and the lift straightener 2134 is installed on the guide baffle 2133. The guide baffle 2133 is arranged to support the lift straightener 2134 and the clamping support 2132, and can guide the clamping support 2132 to move up and down, and the guide baffle 2133 is installed on the support base plate 211, so that the clamping assemblies 213 can be installed on the support base plate 211, and the assembly is convenient.

In one embodiment, when the position seat 2123 is slidably installed on the support base plate 211, the guide baffle 2133 is also slidably installed on the support base plate 211, and the chutes 2111 are also used to guide the guide baffle 2133 to move on the support base plate 211, so that positions of the position seat 2123 and the corresponding guide baffle 2133 on the support base plate 211 can be adjusted, and then the distance between the two roller assemblies 212 and the distance between the two clamping assemblies 213 can be adjusted to accommodate substrates of different sizes.

In one embodiment, referring to FIG. 7 and FIG. 8, the splint mechanism 210 further includes a supporting board 214, the supporting board 214 is supported on the support base plate 211, and the supporting board 214 is used for supporting the substrate. The supporting board 214 is arranged. When the two sides of the substrate are supported on the roller assemblies 212, the supporting board 214 can drag the substrate to support the substrate more stably, and can facilitate the solidification of the substrate on the substrate.

In one embodiment, a plurality of adsorption holes 2141 are provided on the supporting board 214, and adsorption holes 2141 are provided on the supporting board 214. When the substrate is supported on the supporting board 214, the substrate can be adsorbed and fixed by the adsorption holes 2141, so as to drive the substrate to move more smoothly, and pinpoint the substrate.

In one embodiment, opposite sides of the supporting board 214 can be supported on the two position seats 2123, so as to be better aligned with the roller 2122, so as to support the substrate stably.

In one embodiment, referring to FIGS. 6 to 8, the splint mechanism 210 further includes a position assembly 215 for stopping and positioning the substrate supported on the roller assemblies 212, that is, when the substrate is transferred to the two sets of the splint mechanism 210 on the roller assemblies 212, the position assembly 215 stops the substrate to position the substrate on the roller assemblies 212.

In one embodiment, the position assembly 215 includes a block 2151, a lifter 2152 and a mounting bracket 2155. The lifter 2152 is installed on the mounting bracket 2155 to support the lifter 2152 through the mounting bracket 2155. The stops position the substrate, and when block 2151 is lowered, the substrate can move from above block 2151 to move out of roller assemblies 212. A mounting bracket 2155 is installed on one end of the support base plate 211 to mount the position assembly 215 on one end of the support base plate 211.

In one embodiment, the lifter 2152 is an air cylinder, which is small in size, light in weight and easy to control. Understandably, the lifter 2152 can also be a linear module such as a linear motor.

In one embodiment, the position assembly 215 further includes a sliding rail 2154 and a vertical slide 2153, the sliding rail 2154 is arranged vertically, the sliding rail 2154 is installed on the mounting bracket 2155, the vertical slide 2153 is slidably installed on the sliding rail 2154, the block 2151 is installed on the vertical slide 2153, the lifter 2152 and the vertical slide 2153 are connected, the vertical slide 2153 is pushed up and down by the lifter 2152 to drive the block 2151 to move up and down. The sliding rail 2154 and vertical slide 2153 are arranged to support the block 2151 and guide the block 2151 to rise and fall smoothly.

In one embodiment, the plane movement platform 220 includes a traverse module 222 and a vertical movement module 221, the support base plate 211 is installed on the traverse module 222, and the traverse module 222 is installed on the vertical movement module 221. Therefore, the support base plate 211 is driven to move laterally by the traverse module 222, thereby driving the substrate to move laterally. The vertical movement module 221 drives the traverse module 222 to move longitudinally, which in turn drives the splint mechanism 210 and the substrate to move longitudinally. arranging The traverse module 222 and the vertical movement module 221 are arranged to cooperate to drive the substrate to move in two directions perpendicular to each other on the plane, thereby driving the substrate to move on the plane.

In one embodiment, referring to FIG. 6 and FIG. 7, the vertical movement module 221 includes a vertical bottom plate 2211, a plurality of vertical rails 2212, a plurality of vertical sliders 2213 and a vertical drive assembly 2214, and the length direction of the vertical bottom plate 2211 is longitudinally arranged. A plurality of vertical rails 2212 are arranged on the vertical bottom plate 2211 in parallel, and each vertical rail 2212 is arranged to extend along the longitudinal direction. A vertical slider 2213 is installed on each vertical rail 2212, and each vertical slider 2213 is connected to the traverse module 222, so as to support the traverse module 222 through a plurality of vertical sliders 2213, and guide the traverse module 222 to move smoothly in the longitudinal direction. The vertical drive assembly 2214 is installed on the vertical bottom plate 2211, and the vertical drive assembly 2214 is connected to the traverse module 222 to drive the traverse module 222 to move in the longitudinal direction.

In one embodiment, a vertical slot 22111 is defined on the vertical bottom plate 2211, and the vertical drive assembly 2214 is installed in the vertical slot 22111 to reduce the thickness of the vertical movement module 221, thereby reducing the height of the substrate, so as to drive the traverse module 222 and the vertical direction of the substrate more smoothly move.

In one embodiment, vertical drive assembly 2214 includes a vertical nut 22142, a vertical screw 22141, two swivel supports 22143, a vertical drive motor 22144 and a vertical coupling 22145, two swivel supports 22143 are installed on vertical bottom plate 2211, two swivel supports 22143 rotate to support vertical screw 22141, the vertical screw 22141 is arranged vertically, the vertical nut 22142 is installed on vertical screw 22141, the vertical screw 22141 is connected to the vertical drive motor 22144 through the vertical coupling 22145, and the vertical drive motor 22144 drives the vertical screw 22141 to rotate to drive the vertical nut 22142 to move longitudinally, the vertical nut 22142 is connected to the traverse module 222, and then drives the traverse module 222 to move longitudinally. The structure has a large driving force and can smoothly support and push the traverse module 222 and the substrate to move. It can be understood that the vertical drive assembly 2214 can also use linear modules such as linear motors.

In one embodiment, referring to FIG. 6 and FIG. 7, the traverse module 222 includes a transverse base plate 2221, a plurality of transverse rails 2222, a plurality of transverse sliders 2223 and a transverse drive assembly 2224, and the longitudinal direction of the transverse base plate 2221 is arranged laterally. A plurality of transverse rails 2222 are arranged on the transverse base plate 2221 in parallel, and each of the transverse rails 2222 is arranged to extend laterally. A transverse slider 2223 is installed on each of the transverse rails 2222, and each of the transverse sliders 2223 is connected to the traverse module 222, so as to support the traverse module 222 through the cooperation of the plurality of transverse sliders 2223, and guide the traverse module 222 to move smoothly in the lateral direction. The transverse drive assembly 2224 is installed on the transverse base plate 2221, and the transverse drive assembly 2224 is connected to the support base plate 211 to drive the support base plate 211 to move laterally.

In one embodiment, a reverse slot 22211 is defined on the reverse base plate 2221, and a reverse drive assembly 2224 is installed in the reverse slot 22211 to reduce the thickness of the traverse module 222, thereby reducing the height of the substrate, so as to drive the splint mechanism 210 and the lateral movement of the substrate more smoothly.

In one embodiment, the reverse drive assembly 2224 includes a reverse nut 22242, a transverse screw 22241, two rotation supports 22243, a reverse drive motor 22244 and a reverse coupling 22245. The two rotation supports 22243 are installed on the reverse base plate 2221, and the two rotation supports 22243 rotate to support the transverse screw 22241 and the transverse screw 22241. The transverse screw 22241 is arranged in the horizontal direction, the reverse nut 22242 is installed on the transverse screw 22241, and the transverse screw 22241 is connected to the reverse drive motor 22244 through the reverse coupling 22245, so that the reverse drive motor 22244 drives the transverse screw 22241 to rotate, so as to drive the reverse nut 22242 to move laterally, and the reverse nut 22242 is connected to the support base plate 211, and then drives the splint mechanism 210 moves laterally. It can be understood that the transverse drive assembly 2224 can also use linear modules such as linear motors.

In one embodiment, referring to FIG. 2 and FIG. 9, the die ring supply unit 300 includes a feeding mechanism 310, a delivery platform 330, a reclaiming mechanism 320 and a delivery mechanism 340, the feeding mechanism 310 and the reclaiming mechanism 320 are respectively provided on opposite sides of the delivery platform 330, and the delivery platform 330 is provided below the delivery mechanism 340. The feeding mechanism 310 is used to support the die ring box 96 and drive the die ring box 96 to move up and down. The die ring box 96 that stores the die ring 97 is installed on the feeding mechanism 310, and since a plurality of pieces of die ring 97 are generally stored in the die ring box 96, the feeding mechanism 310 drives the die ring box 96 to move up and down, so that the reclaiming mechanism 320 can take out the each full die ring 971 in the box 96 die ring in sequence, and the empty die ring 972 is put into the vacancy in the die ring box 96 to recover the empty die ring 972. The delivery platform 330 is used to drive at least two die rings 97 to move synchronously. The delivery platform 330 has at least two accommodating slots 3311, and the accommodating slots 3311 are used to store the die ring 97. In this way, the delivery platform 330 can support at least one empty die ring 972 and at least one full die ring 971 at the same time.

The reclaiming mechanism 320 is used to pick and place the full die ring 971 in the die ring box 96 to the delivery platform 330 and transfer the empty die ring 972 in the delivery platform 330 to the die ring box 96. Since the delivery platform 330 is provided with at least two accommodating slots 3311 for accommodating the die ring 97; in this way, at least one empty die ring 972 can be supported on the delivery platform 330, and the reclaiming mechanism 320 can take out the full die ring 971 in the die ring box 96 and place the full die ring 971 in an empty accommodating slot 3311 of the delivery platform 330, the reclaiming mechanism 320 can take out the empty die ring 972 on the delivery platform 330 and place the empty die ring 972 on the die ring box 96, so that there is no need to wait when picking and placing the die ring 97 at the die ring box 96.

The delivery mechanism 340 is used to transfer the empty die ring 972 on the die supply position to the delivery platform 330 and transfer the full ring die 971 on the delivery platform 330 to the die supply position. Since the delivery platform 330 is provided with at least two accommodating slots 3311 for accommodating the die ring 97; in this way, at least one full die ring 971 can be supported on the delivery platform 330, the delivery mechanism 340 can take out the empty die ring 972 at the die supply position and place it on the delivery platform 330 An empty accommodating slot 3311, and the delivery mechanism 340 can take out the full die ring 971 on the delivery platform 330 and place it at the die supply position, so that there is no need to wait when picking and placing the die ring 97 at the die supply position.

After the delivery mechanism 340 takes out the full die ring 971 on the delivery platform 330, the delivery platform 330 can drive the empty die ring 972 to the feeding mechanism 310, so that the reclaiming mechanism 320 can place the empty die ring 972 on the die ring box 96, or the reclaiming mechanism 320 can take out the full die ring 971 and place the full die ring 971 on the delivery platform 330, and after the reclaiming mechanism 320 places the full die ring 971 on the delivery platform 330 and takes out the empty die ring 972 on the delivery platform 330, the delivery platform 330 can drive the full die ring 971 to the delivery mechanism 340, so that the delivery mechanism 340 places the empty die ring 972 on the delivery platform 330, Or the delivery mechanism 340 can take out the empty die ring 972 and place the empty die ring 972 on the delivery platform 330, without waiting time and high efficiency.

In one embodiment, when the delivery platform 330 drives the empty die ring 972 to move to the feeding mechanism 310, the reclaiming mechanism 320 places the full die ring 971 on the delivery platform 330 and takes out the empty die ring 972 on the delivery platform 330; the delivery platform 330 can drive the full die ring 971 to the delivery mechanism 340, the delivery mechanism 340 places the empty die ring 972 at the die supply position on the delivery platform 330, and the delivery mechanism 340 takes out the full die ring 971 on the delivery platform 330. After that, the delivery platform 330 drives the empty die ring 972 to move to the feeding mechanism 310. This cycle has high efficiency.

Figure 9:
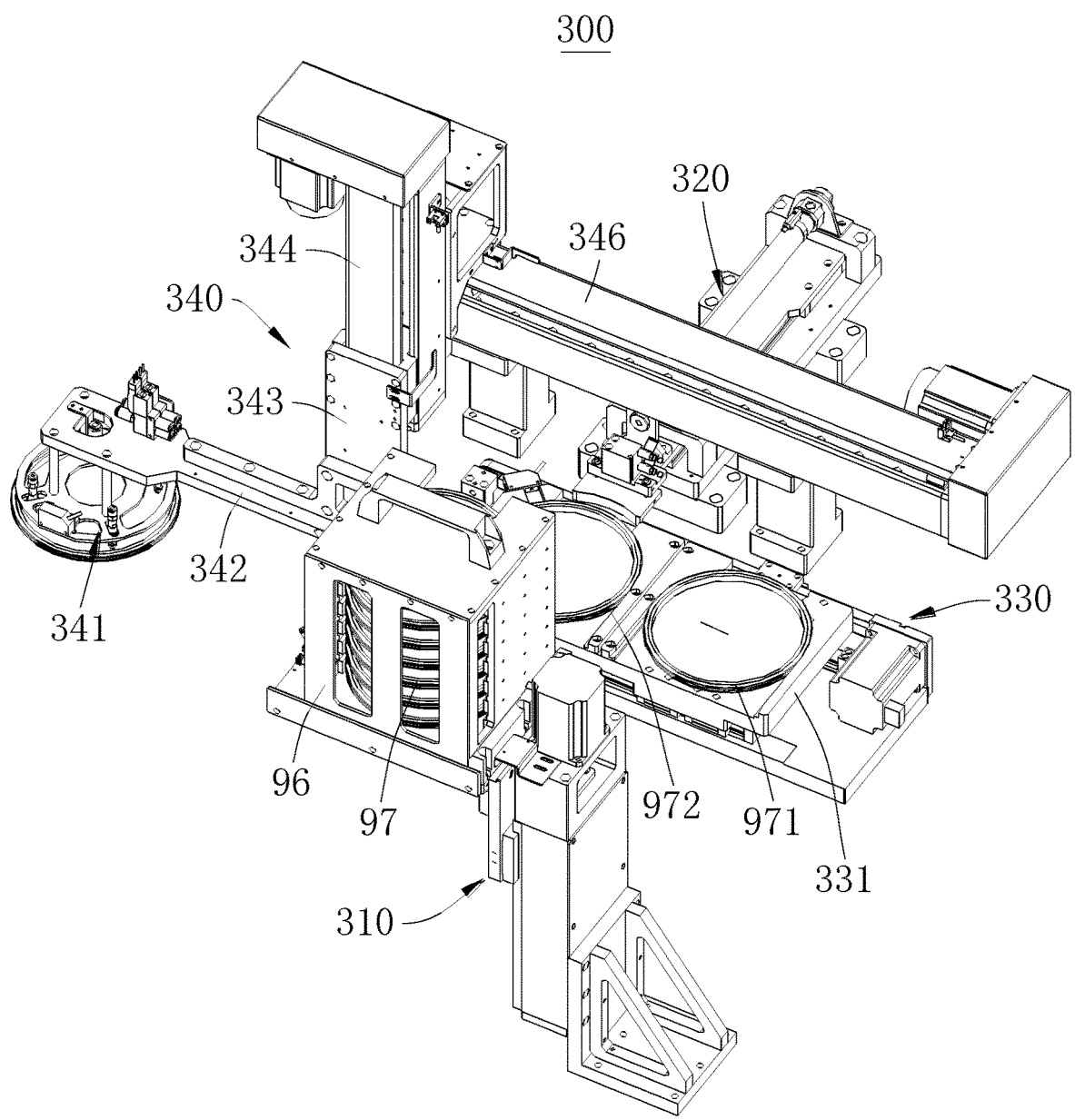
FIG. 9 is a schematic structural diagram of a die ring supply unit provided by an embodiment of the present application.
Figure 12:
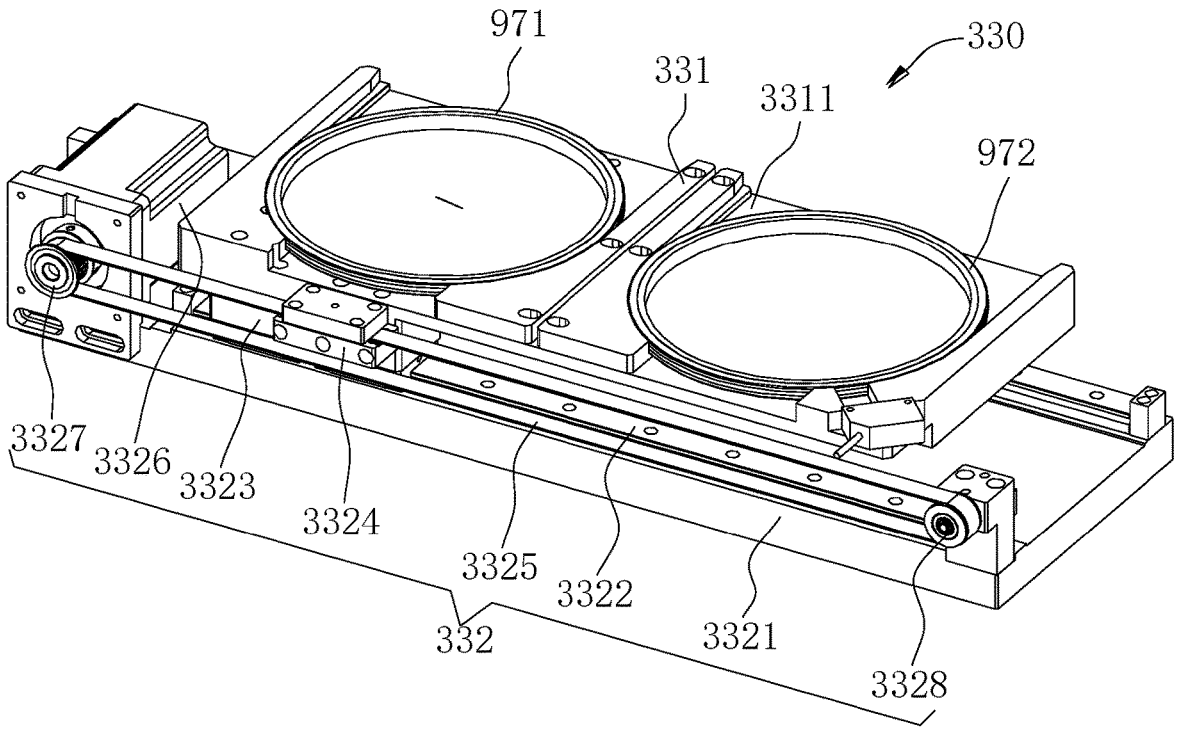
FIG. 12 is a schematic structural diagram of a delivery platform provided by an embodiment of the present application.

In one embodiment, referring to FIG. 9 and FIG. 12, the delivery platform 330 includes a tray 331 and a linear driving module 332, and each accommodating slot 3311 is provided on the tray 331 to support the die ring 97 on the tray 331. The tray 331 is installed on the linear driving module 332, and the linear driving module 332 is used to drive the tray 331 to travel back and forth between the reclaiming mechanism 320 and the delivery mechanism 340, thereby driving the die ring 97 on the tray 331 to move.

In one embodiment, the tray 331 is provided with two accommodating slots 3311 to reduce the volume of the tray 331 and facilitate the flexible driving of the tray 331 to move.

In one embodiment, two accommodating slots 3311 are arranged at intervals along the moving direction of the tray 331, so that the tray 331 can be driven to move more smoothly.

In one embodiment, the linear driving module 332 includes a loading base plate 3321, a loading guide rail 3322, a loading slider 3323, a loading drive motor 3326, a main drive wheel 3327, a slave drive wheel 3328, a loading belt 3325 and a loading clamp 3324. The tray 331 is installed on the loading slider 3323 and the loading slider 3323 is used to support the tray 331. The loading guide rail 3322 is installed on the loading base plate 3321 to support the loading guide rail 3322 by the loading base plate 3321. The loading slider 3323 is slidably installed on the loading guide rail 3322, and supports and guides the loading slider 3323 to move through the loading guide rail 3322, thereby supporting and guiding the tray 331 to move. The main drive wheel 3327 and the slave drive wheel 3328 are respectively located at the two ends of the loading base plate 3321, the loading belt 3325 is tensioned by the main drive wheel 3327 and the slave drive wheel 3328, and the main drive wheel 3327 is installed on the loading drive motor 3326, and the loading drive motor 3326 is installed on the loading base plate 3321 so that the main drive wheel 3327 is supported on one end of the loading base plate 3321, the loading clamp 3324 is connected to the tray 331, and the loading clamp 3324 clamps and fixes the loading belt 3325, thereby connecting the loading belt 3325 to the tray 331, so that the loading drive motor 3326 drives the main drive wheel 3327 to rotate to drive the loading belt 3325 to move, thereby pulling the loading clamp 3324 to move in a straight line, thereby driving the tray 331 to move. Using the loading belt 3325, the structure is simple and the assembly is convenient. It can be understood that the linear driving module 332 can also use linear modules such as a screw-and-nut mechanism, a rack-and-pinion mechanism, and a linear motor.

In one embodiment, there are at least two loading guide rails 3322, and a plurality of loading guide rails 3322 are arranged in parallel, and a loading slider 3323 is installed on each loading guide rail 3322, and each loading slider 3323 is connected to the tray 331, so as to support the tray 331 more smoothly and guide the tray 331 to move.

Figure 11:
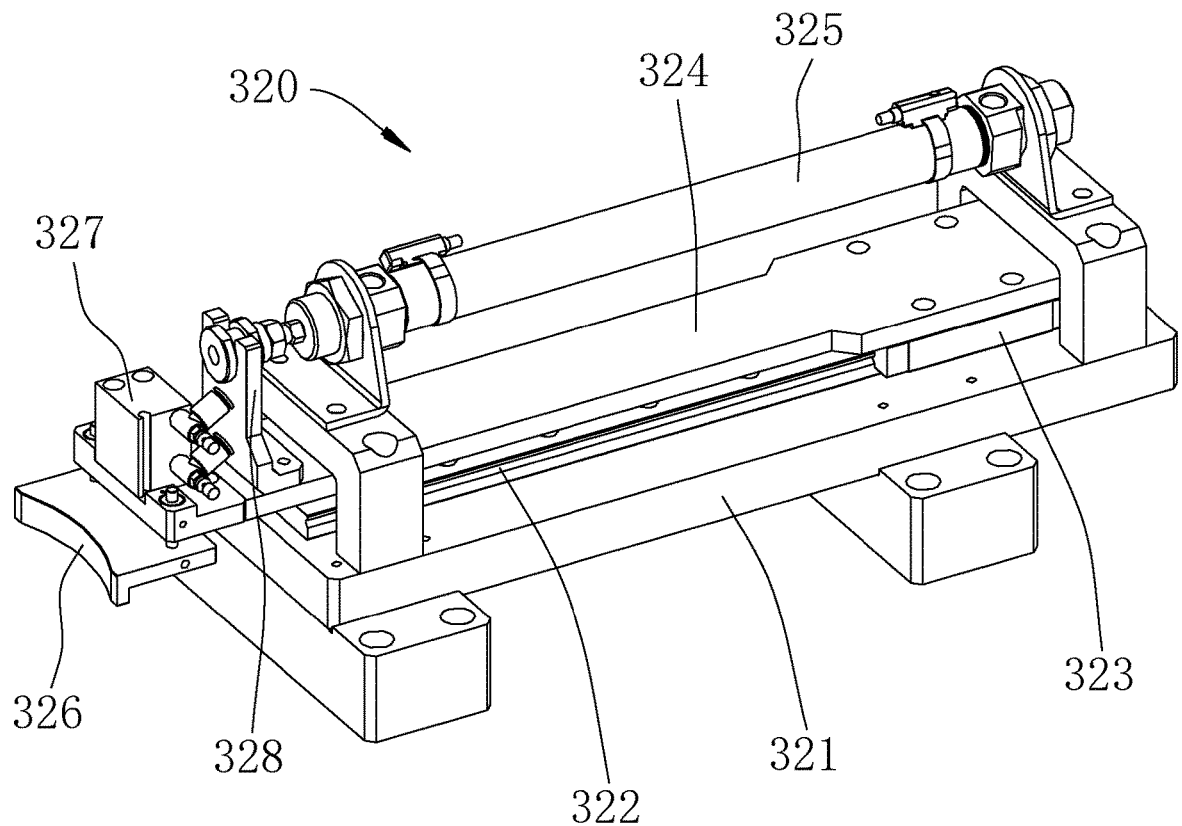
FIG. 11 is a schematic structural diagram of a reclaiming mechanism provided by an embodiment of the present application.

In one embodiment, referring to FIGS. 9 and 11, the reclaiming mechanism 320 includes a moving clamp 326, a clamping driver 327, a sliding push plate 324, a slider block 323, a linear push module 325, a sliding guide rail 322 and a reclaiming support 321. The linear push module 325 is installed on the reclaiming support 321, the sliding guide rail 322 is installed on the reclaiming support 321, and the linear push module 325 and the sliding guide rail 322 are supported by the reclaiming support 321. The slider block 323 is installed on the sliding guide rail 322 to guide the slider block 323 to move through the sliding guide rail 322. The clamping driver 327 is installed on the sliding push plate 324, and the clamping driver 327 is supported by the sliding push plate 324. The clamping driver 327 is connected to the moving clamp 326 to drive the moving clamp 326 so that the moving clamp 326 clamps the die ring 97. The driving end of the linear push module 325 is connected to the sliding push plate 324, so that the driving end of the linear push module 325 drives the sliding push plate 324 to move along the sliding guide rail 322, thereby driving the moving clamp 326 to move, so as to remove the full die ring 971 from the die ring box 96 and remove the empty die ring 971 from the die ring box 96. The die ring 972 is placed in the die ring box 96. The reclaiming mechanism 320 has simple structure, convenient installation and low cost.

In one embodiment, the linear push module 325 is an air cylinder, and the air cylinder is used, which has a simple structure, convenient control and low cost. It can be understood that the linear push module 325 can also use linear modules such as a screw-nut mechanism, a rack-and-pinion mechanism, and a linear motor.

In one embodiment, a connecting support plate 328 is installed on the sliding push plate 324, and the connecting support plate 328 is connected to the driving end of the linear push module 325. The connecting support plate 328 is provided to facilitate the connection of the driving end of the cylinder with the sliding push plate 324, and the connection is convenient.

In one embodiment, the clamping driver 327 can be an air cylinder, which is convenient to control and small in size. It can be understood that the clamping driver 327 can also be a linear module such as a screw-nut mechanism, a rack-and-pinion mechanism, and a linear motor.

Figure 10:
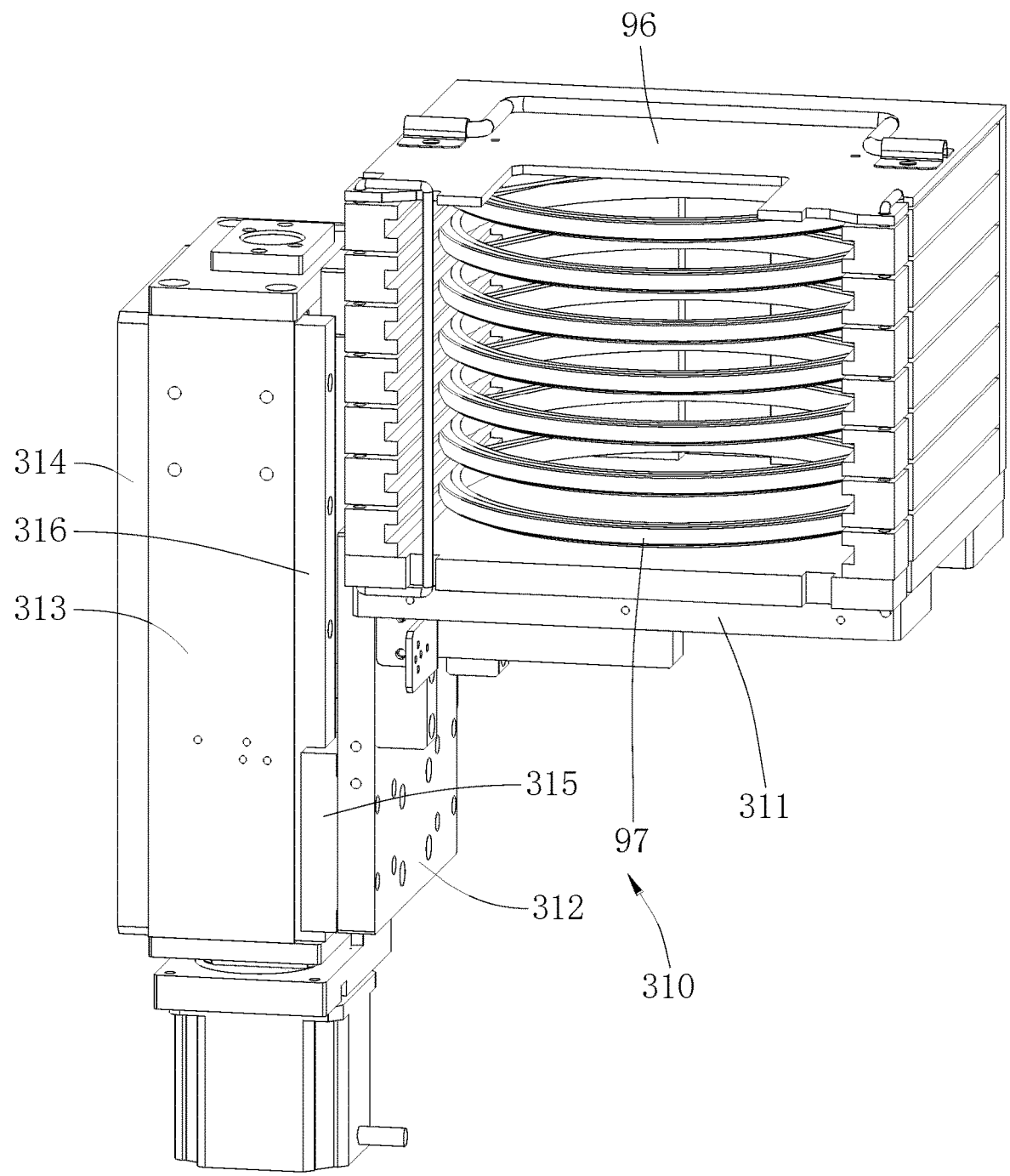
FIG. 10 is a schematic structural diagram of the feeding mechanism supporting the die ring box provided by the embodiment of the present application.

In one embodiment, referring to FIGS. 9 and 10, the feeding mechanism 310 includes a position pallet 311, a lifting slide plate 312, a sliding block 315, a vertical guide rail 316, a linear advancing module 313 and a fixing seat 314. The linear advancing module 313 and the vertical guide rail 316 are installed on the fixing seat 314. The linear advancing module 313 and the vertical guide rail 316 are supported by the fixing seat 314. The sliding block 315 is installed on the vertical guide rail 316 to guide the sliding block 315 to ascend and descend through the vertical guide rail 316. The sliding block 315 is connected to the lifting slide plate 312 to support the lifting slide plate 312 through the sliding block 315. The lifting slide plate 312 is connected to the position pallet 311 to support the position pallet 311 through the lifting slide plate 312. The position pallet 311 is used to support the die ring box 96, the die ring box 96 is placed on the position pallet 311, and the linear advancing module 313 drives the lifting slide plate 312 to move up and down, thereby driving the position pallet 311 and the die ring box 96 up and down to realize the supply of the die ring 97.

In one embodiment, the linear advancing module 313 is a lead screw nut mechanism, and the lead screw nut mechanism is used, and the driving force is large and the operation is stable. It can be understood that the linear advancing module 313 can also use linear modules such as a rack and pinion mechanism, a linear motor, and the like.

Figure 13:
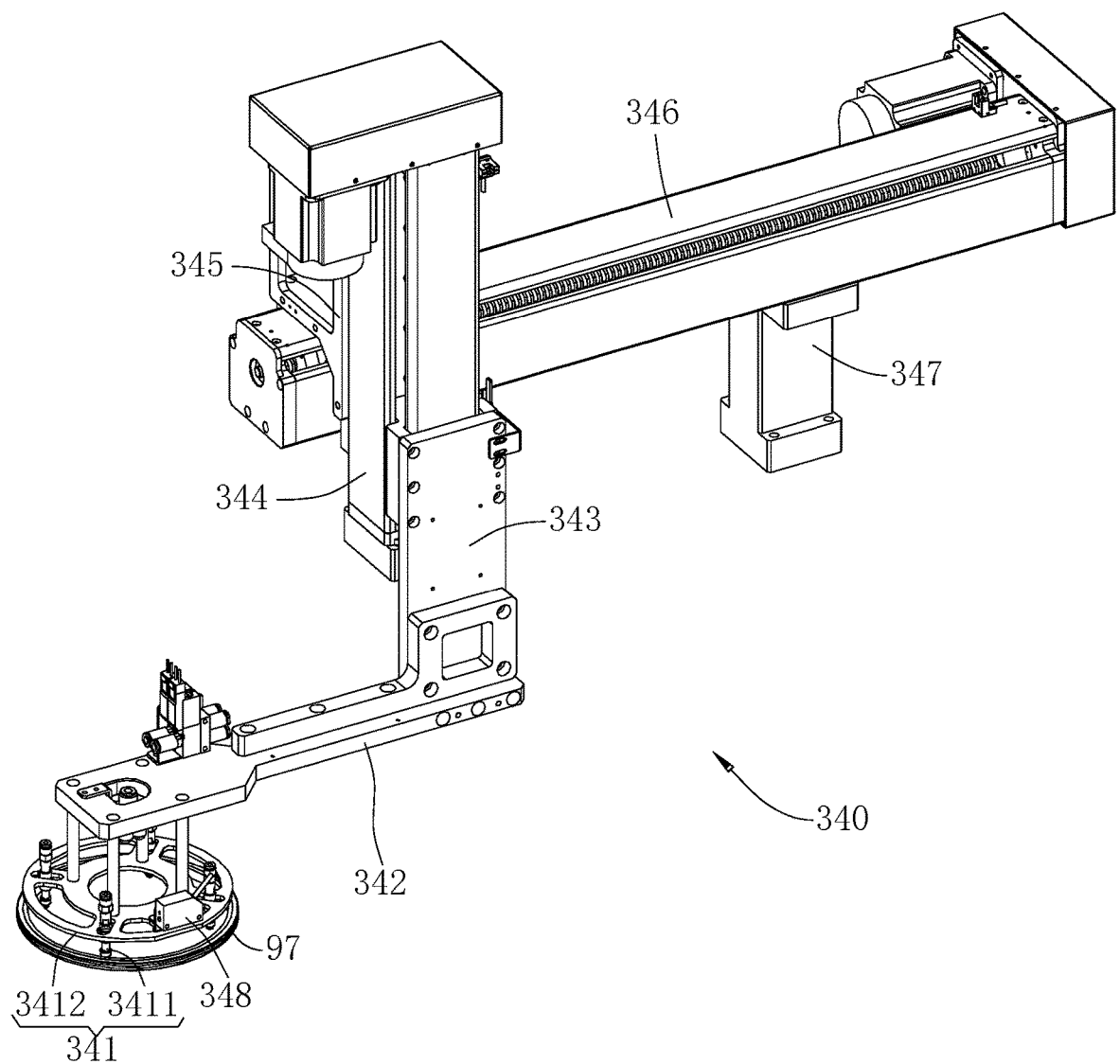
FIG. 13 is a schematic structural diagram of a delivery mechanism provided by an embodiment of the present application.

In one embodiment, referring to FIGS. 9 and 13, the delivery mechanism 340 includes a grab assembly 341, a connecting frame 342, a lifting seat 343, a lift drive module 344, a mounting slide 345, a linear travel module 346 and a travel support 347. The grab assembly 341 is used to grab die ring 97. The grab assembly 341 is installed on the connecting frame 342, supports the grab assembly 341 through the connecting frame 342, and drives the grab assembly 341 to move. The connecting frame 342 is installed on the lifting seat 343, and the connecting frame 342 is supported by the lifting seat 343. The lifting seat 343 is connected to the lift drive module 344, and the lifting seat 343 is driven to move up and down by the lift drive module 344, thereby driving the grab assembly 341 to move up and down. The lift drive module 344 is installed on the mounting slide 345, and the lift drive module 344 is supported by the mounting slide 345.

The mounting slide 345 is connected to the linear travel module 346 to drive the mounting slide 345 back and forth between the die supply position and the delivery platform 330 through the linear travel module 346, so as to realize the grabbing and placing of the empty die ring 972 on the die supply position on the delivery platform 330, and the full die ring 971 is moved to the die supply position.

In one embodiment, the grab assembly 341 includes a plurality of suction cups 3411 and a support plate 3412, the plurality of suction cups 3411 are installed on the support plate 3412, and the plurality of suction cups 3411 are supported by the support plate 3412, so that the plurality of suction cups 3411 cooperate with the suction die ring 97 to grab the die ring 97. The support plate 3412 is connected to the connecting frame 342 to connect each of the suction cups 3411 to the connecting frame 342. It can be understood that the grab assembly 341 can also use structures such as manipulators, cylinder clamps, and adsorption plates.

In one embodiment, the linear travel module 346 is arranged across the delivery platform 330 to facilitate driving the lift drive module 344, the lifting seat 343, the connecting frame 342 and the grab assembly 341 to move on the delivery platform 330 for grabbing the die ring 97.

In one embodiment, the delivery mechanism 340 further includes a sensor 348, the sensor 348 is installed on the support plate 3412, and the sensor 348 senses the die ring 97, so as to position the plurality of suction cups 3411 and facilitate the suction of the die ring 97.

In one embodiment, the size of the support plate 3412 is equal to or similar to the size of the die ring 97 so as to locate the plurality of suction cups 3411 and also facilitate the suction cups 3411 to suck the die ring 97.

In one embodiment, the lift drive module 344 is a lead screw nut mechanism, using a lead screw nut mechanism, the driving force is large and the operation is stable. It can be understood that the lift drive module 344 can also use linear modules such as a rack and pinion mechanism and a linear motor.

In one embodiment, the linear travel module 346 is a screw-and-nut mechanism, and the screw-nut mechanism is used, and the driving force is large and the operation is stable. It can be understood that the linear travel module 346 can also use linear modules such as a rack and pinion mechanism, a linear motor, and the like.

Figure 14:
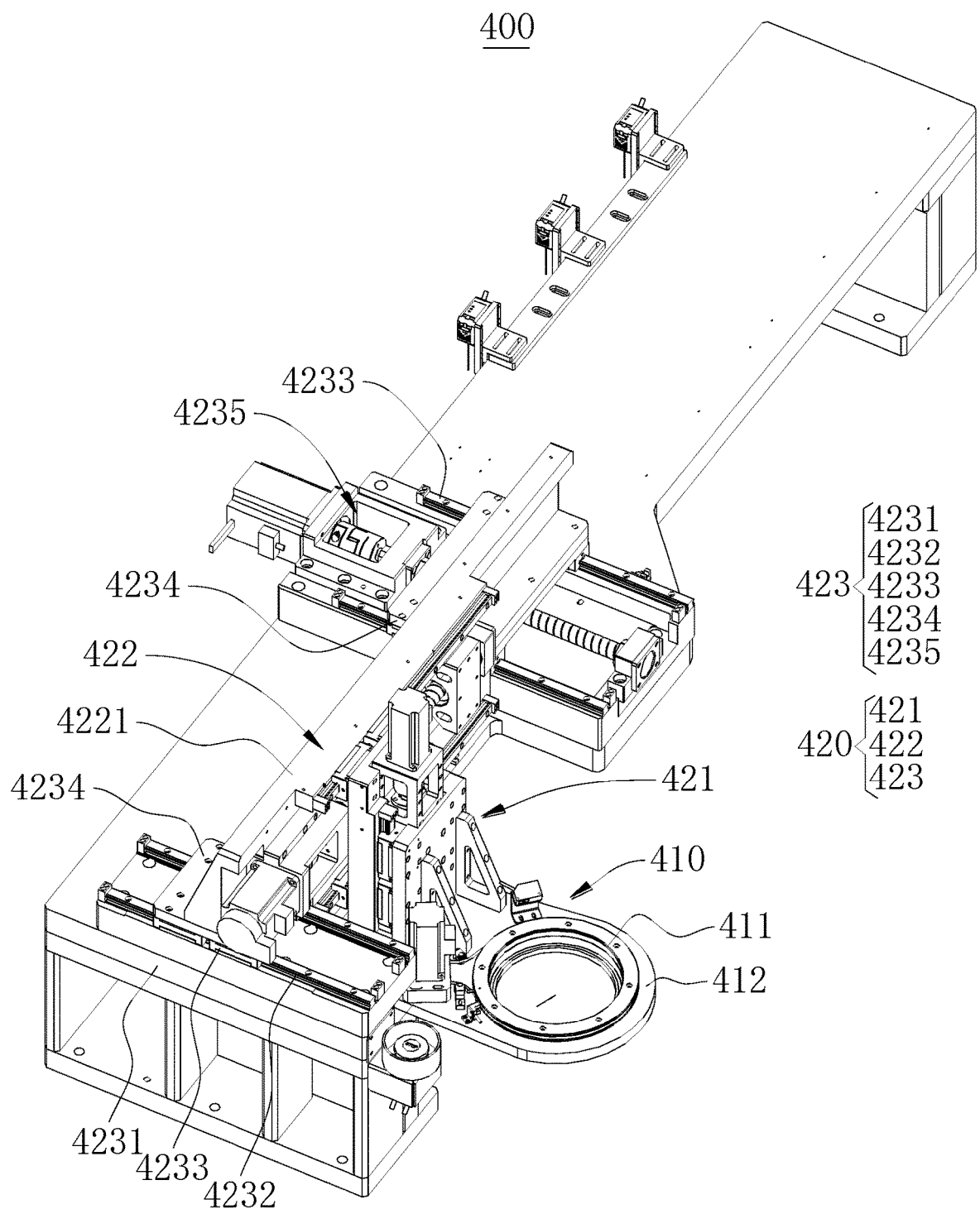
FIG. 14 is a schematic structural diagram of a die supply unit provided by an embodiment of the present application.
Figure 15:
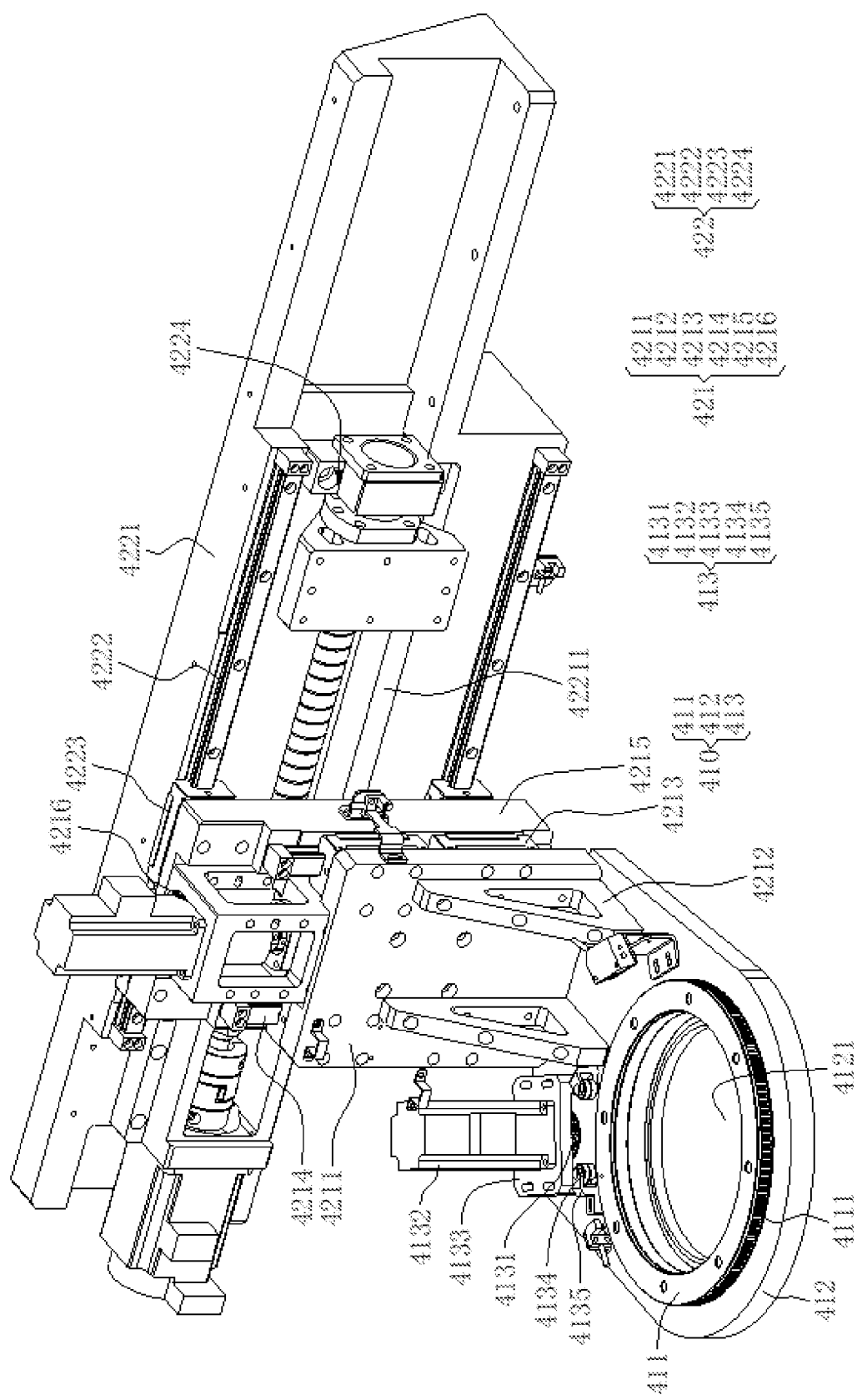
FIG. 15 is a schematic structural diagram of the die frame rotation mechanism, lifting mechanism and traverse mechanism in FIG. 14.

In one embodiment, referring to FIG. 2, FIG. 14 and FIG. 15, the die supply unit 400 includes a die frame rotation mechanism 410 and a moving platform 420, the die frame rotation mechanism 410 is connected to the moving platform 420, and the spatial position of the die frame rotation mechanism 410 is adjusted through the moving platform 420, so that each die on the die ring 97 can be moved to the die extraction position, respectively, for die extraction. The die frame rotation mechanism 410 includes a supporting plate 412, a rotating die frame 411 and a rotary drive module 413. The rotating die frame 411 is used to carry the die ring 97 and drive the die ring 97 to rotate. When in use, the die ring 97 is placed in the rotating die frame 411 and rotated and the die frame 411 supports the die ring 97. When the rotating die frame 411 rotates, it can drive the die ring 97 to rotate, so as to adjust the angle of the die in the die ring 97. The rotary drive module 413 is connected to the rotating die frame 411 to provide power through the rotary drive module 413 to drive the rotating die frame 411 to rotate, thereby adjusting the angle of the die ring 97 in the rotating die frame 411. The rotary drive module 413 is located at one side of the rotating die frame 411, so that the rotary drive module 413 can be prevented from covering the rotating die frame 411 to facilitate die extraction.

Both the rotary drive module 413 and the rotating die frame 411 are installed on the supporting plate 412, and the rotary drive module 413 and the rotating die frame 411 are supported by the supporting plate 412. Since the rotating die frame 411 has a ring structure, it has a hollow position. An opening 4121 is defined on the supporting plate 412. After the rotating die frame 411 is installed on the supporting plate 412, the opening 4121 is located at the corresponding position of the hollow position of the rotating die frame 411 to expose the hollow position of the rotating die frame 411. In this way, when the die ring 97 is placed in the rotating die frame 411, the opening 4121 can expose the wafer in the die ring 97 to take die from the opening 4121.

The supporting plate 412 is connected to the moving platform 420, so that the spatial position of the supporting plate 412 can be adjusted through the moving platform 420, and then the spatial position of the die can be adjusted for die taking. The supporting plate 412 is disposed on the side of the moving platform 420, so that the supporting plate 412 and the rotating die frame 411 can be suspended, so that the overall thickness of the rotating die frame 411 is small, so that the die can be taken from the bottom of the rotating die frame 411, and then the taken out die can be removed. It is directly transferred to the bonding head without flipping the die, which can improve the bonding efficiency.

The rotary drive module 413 is installed on the supporting plate 412, and the rotary drive module 413 is located on the side of the rotating die frame 411 close to the moving platform 420, so that the entire rotating die frame 411 can be moved at the die extraction position to avoid the rotary drive module 413 blocking die extraction. In addition, this structure can make the center of gravity of the die frame rotation mechanism 410 closer to the moving platform 420, and also facilitate the moving platform 420 to support the die frame rotation mechanism 410 stably and drive the die frame rotation mechanism 410 to move in space, so as to smoothly adjust the spatial position of the die frame rotation mechanism 410.

Figure 16:
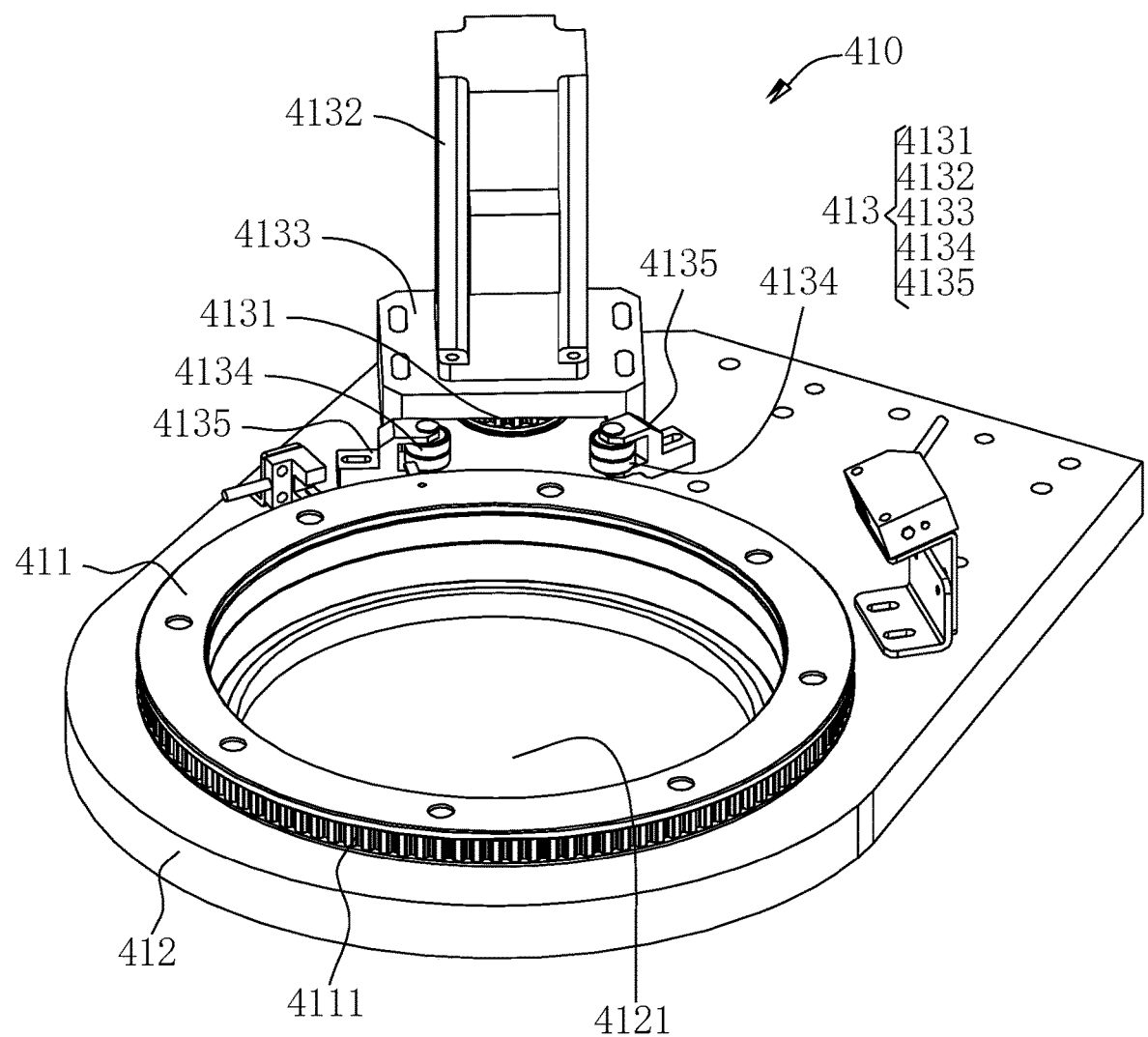
FIG. 16 is a schematic structural diagram of the die frame rotation mechanism in FIG. 15.
Figure 17:
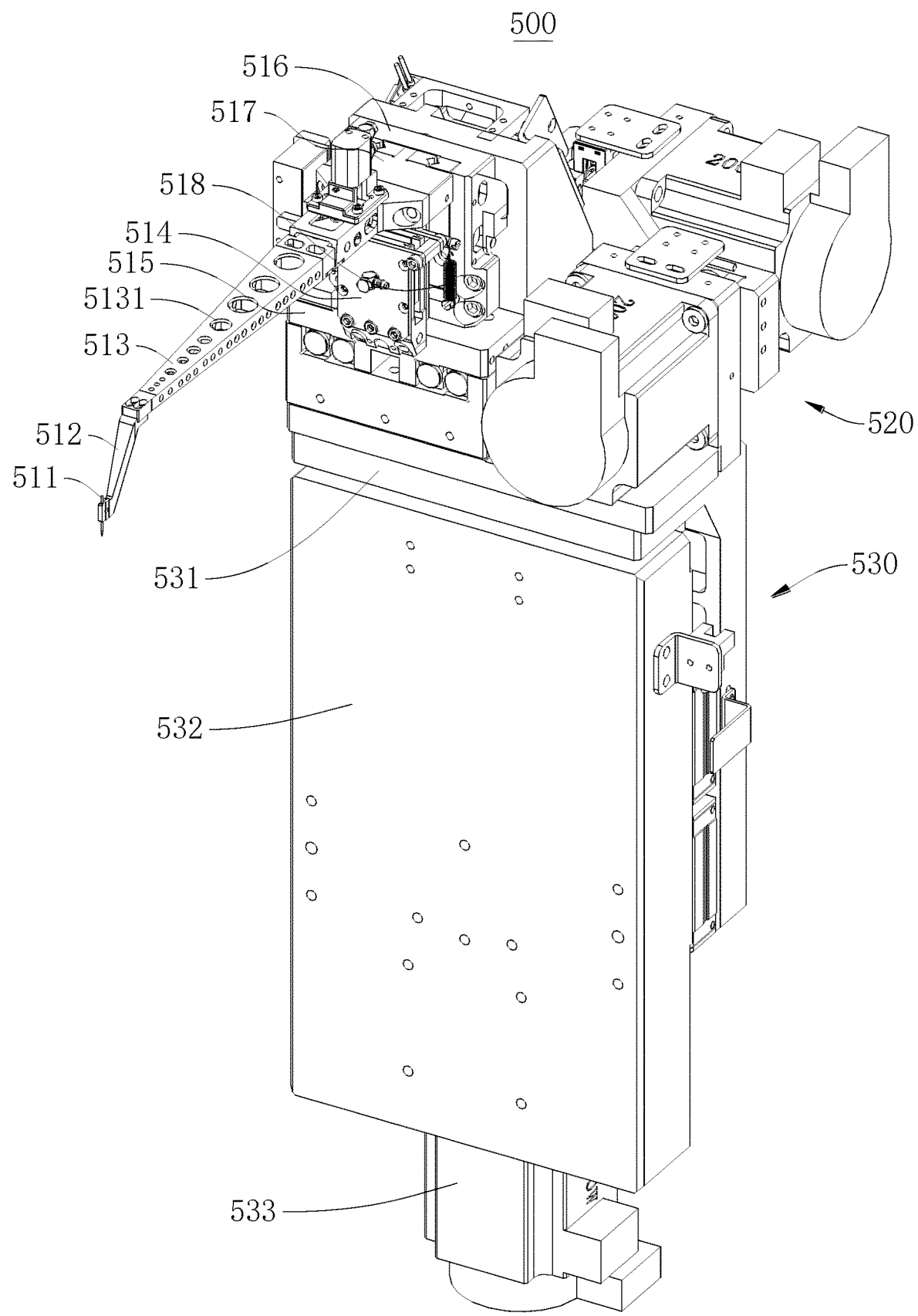
FIG. 17 is a schematic structural diagram of a piercing mechanism provided by an embodiment of the application.
Figure 18:
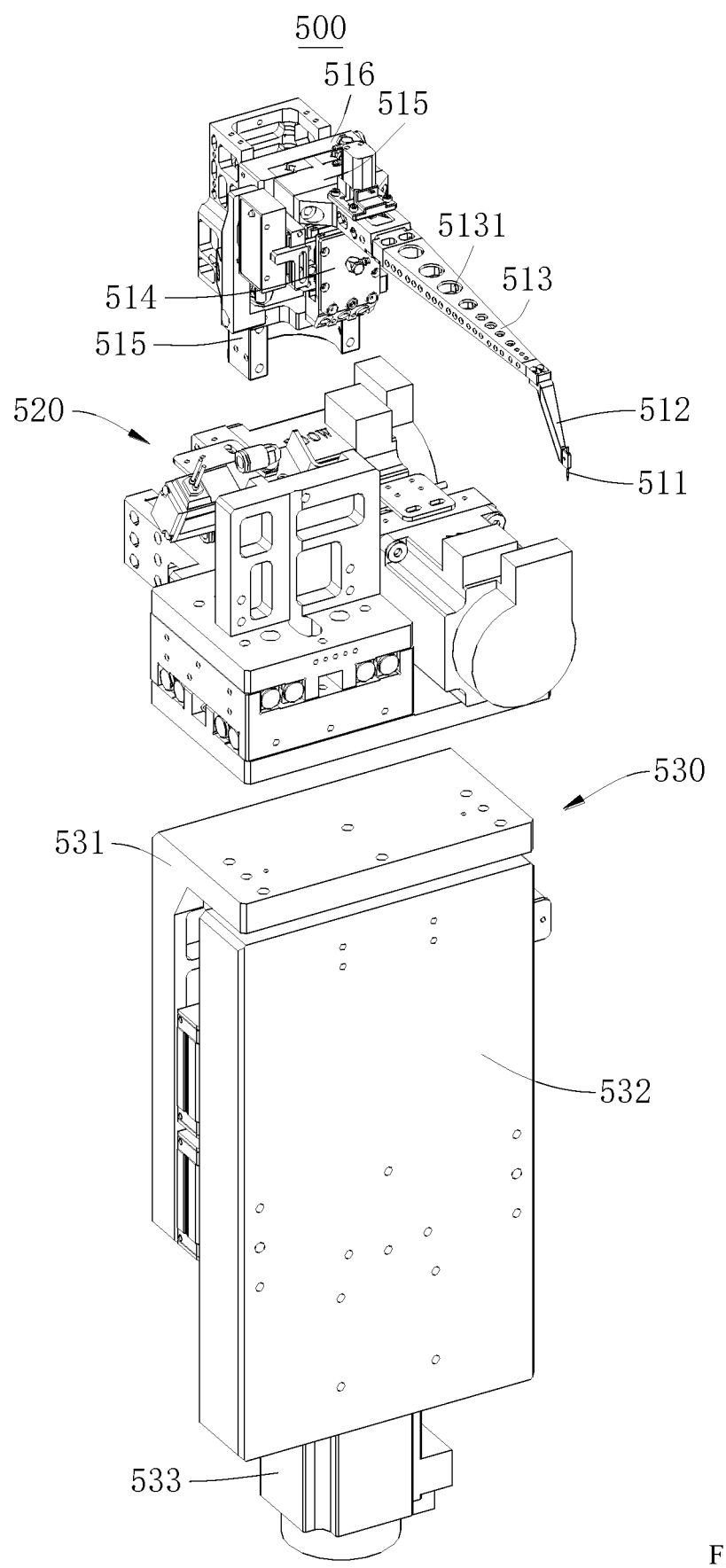
FIG. 18 is a schematic diagram of an exploded structure of a piercing mechanism provided by an embodiment of the application.
Figure 19:
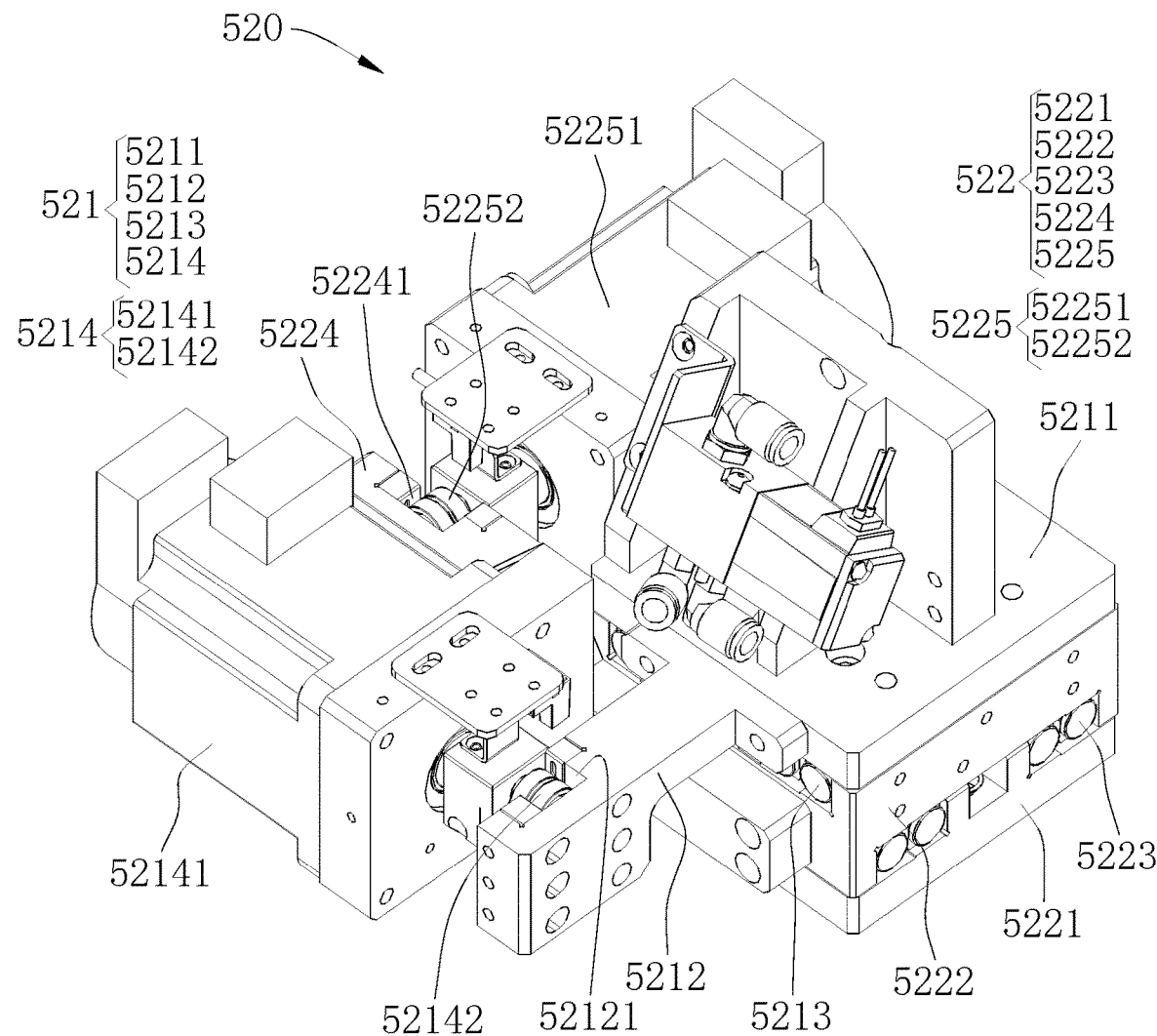
FIG. 19 is a schematic structural diagram of a die supply camera unit provided by an embodiment of the application.

In one embodiment, referring to FIG. 14 to FIG. 16, the rotary drive module 413 includes a rotating wheel 4131, a rotating drive motor 4132, a supporting seat 4133 and a connecting piece (not shown). The rotating wheel 4131 is installed on the rotating drive motor 4132 and is driven by the rotating drive motor 4132. The rotating wheel 4131 rotates. The rotating drive motor 4132 is installed on the supporting seat 4133, the supporting seat 4133 is installed on the supporting plate 412, and the supporting seat 4133 is located on the side where the die frame is placed near the moving platform 420, so that the rotating drive motor 4132 is supported on the supporting plate 412 on the side near the moving platform 420 through the supporting seat 4133. The connecting piece connects the rotating wheel 4131 and the rotating die frame 411. When the rotating wheel 4131 rotates, the rotating die frame 411 can be driven to rotate through the connecting piece to adjust the angle of the die ring 97 in the rotating die frame 411. The rotary drive module 413 has a simple structure, convenient control, light weight and convenient assembly.

In one embodiment, the connecting member is a transmission belt, and the transmission belt connects the rotating wheel 4131 and the rotating die frame 411. The rotating wheel 4131 drives the rotating die frame 411 to rotate through a transmission belt. It is convenient to use the transmission belt to connect, and the installation accuracy is low.

In one embodiment, external teeth 4111 are provided on the outer circumference of the rotating die frame 411, the rotating wheel 4131 is a gear, and the transmission belt is a toothed belt. In this way, the rotating wheel 4131 can precisely control the rotation of the rotating die frame 411 via the transmission belt, and the control precision is high. It can be understood that the transmission belt can also be a belt, and the outer circumference of the rotating die frame 411 is provided with external teeth 4111 to increase friction. Similarly, when the transmission belt is a belt and the rotating wheel 4131 is a gear, the friction between the transmission belt and the rotating wheel 4131 can also be increased.

In one embodiment, the rotary drive module 413 further includes a tensioner 4134 and a wheel seat 4135, and the wheel seat 4135 is installed on the supporting plate 412. The tensioner 4134 is rotatably installed on the wheel seat 4135 to support the tensioner 4134, and the tensioner 4134 presses the transmission belt, so that the transmission belt is closely attached to the rotating wheel 4131 and the rotating die frame 411, so that the rotating wheel 4131 rotates, drives the transmission belt to move, and then drives the rotating die frame 411 to rotate.

It can be understood that the rotating wheel 4131 is a gear, the outer circumference of the rotating die frame 411 is provided with external teeth 4111, then the connecting piece can be an intermediate gear, which meshes with the rotating wheel 4131 through the intermediate gear, and the intermediate gear meshes with the external teeth 4111 of the rotating die frame 411, then when the rotating wheel 4131 rotates, the intermediate gear can be driven to rotate, thereby driving the rotating die frame 411 to rotate. Using gear transmission is of high precision and convenient control.

In one embodiment, referring to FIGS. 14 and 15, the moving platform 420 includes a lifting mechanism 421, a traverse mechanism 422 and a vertical mechanism 423. The lifting mechanism 421 is used to support and drive the supporting plate 412 to move up and down, the traverse mechanism 422 is used to drive the supporting plate 412 to move laterally, and the vertical mechanism 423 is used to drive the supporting plate 412 to move longitudinally, so as to adjust the space position of the supporting plate 412 and then adjust the space of the die in the rotating die frame 411 position for taking dies. The lifting mechanism 421 is connected to the traverse mechanism 422, and the traverse mechanism 422 drives the lifting mechanism 421 to move laterally, thereby driving the die frame rotation mechanism 410 to move laterally as a whole. The traverse mechanism 422 is installed on the vertical mechanism 423, and the vertical mechanism 423 drives the traverse mechanism 422 to move longitudinally, thereby driving the lifting mechanism 421 and the die frame rotation mechanism 410 to move longitudinally as a whole.

In one embodiment, referring to FIGS. 14 and 15, the lifting mechanism 421 includes a lifting plate 4211, a connecting plate 4212, a lifting slider 4213, a vertical rail 4214, a lifting support 4215 and a linear drive module 4216. The connecting plate 4212 connects the lifting plate 4211 and the supporting plate 412 to ensure that the supporting plate 412 and the lifting plate 4211 are connected firmly and stably, so that the lifting plate 4211 supports the supporting plate 412 stably. The lifting plate 4211 is located at one end of the supporting plate 412, so that the supporting plate 412 is suspended on one side of the lifting plate 4211, and the rotating die frame 411 is suspended on one side of the lifting mechanism 421. The lifting slider 4213 is connected to the lifting plate 4211, and the lifting plate 4211 is supported by the lifting slider 4213. The lifting slider 4213 is slidably installed on the vertical rail 4214, so as to guide the lifting slider 4213 to move up and down smoothly through the vertical rail 4214, thereby guiding the lifting plate 4211 to move up and down smoothly. The vertical rail 4214 is installed on the lifting support 4215, and the linear drive module 4216 is installed on the lifting support 4215 to support the vertical rail 4214 and the linear drive module 4216 through the lifting support 4215. The linear drive module 4216 is used to drive the lifting slider 4213 to move up and down to drive the lifting plate 4211 to move up and down, thereby adjusting the height of the die frame rotation mechanism 410.

In one embodiment, the linear drive module 4216 is a screw-and-nut mechanism, so as to drive the supporting plate 412 to move up and down smoothly, accurately and quickly, so as to adjust the height of the rotating die frame 411 smoothly, precisely and quickly. It can be understood that the linear drive module 4216 can also be a linear module such as a linear motor and a rack and pinion mechanism.

In one embodiment, the vertical rails 4214 are at least two arranged in parallel, each vertical rail 4214 is provided with a lifting slider 4213, and the two sides of the linear drive module 4216 are respectively provided with vertical rails 4214 to stably support the lifting plate 4211 and drive the lifting plate 4211 to move smoothly.

In one embodiment, referring to FIGS. 14 and 15, the traverse mechanism 422 includes a traverse support 4221, a reverse slider 4223, a reverse rail 4222 and a linear push module 4224. The traverse support 4221 is arranged in the lateral direction, the length direction of the traverse support 4221 is arranged in the lateral direction, so as to support the transverse rail 4222. The lifting support 4215 of the lifting mechanism 421 is installed on the reverse slider 4223, and the lifting support 4215 is supported by the reverse slider 4223. The transverse slider 4223 is installed on the transverse rail 4222, and the transverse rail 4222 supports and guides the transverse slider 4223 to move laterally, thereby guiding the lifting support 4215 to move laterally, so as to drive the die frame rotation mechanism 410 to move laterally. The linear push module 4224 is installed on the traverse support 4221, the transverse rail 4222 is installed on the traverse support 4221, and the linear push module 4224 and the transverse rail 4222 are supported by the traverse support 4221. The linear push module 4224 drives the lifting support 4215 to move laterally, thereby driving the entire lifting mechanism 421 and the die frame rotation mechanism 410 to move laterally.

The groove 42211 is opened on the traverse support 4221, and the linear push module 4224 is placed in the groove 42211. A groove 42211 is provided on the traverse support 4221 to accommodate the linear push module 4224, which facilitates the assembly of the linear push module 4224, reduces the volume and occupied space of the traverse mechanism 422, and reduces the weight of the traverse mechanism 422, so that the longitudinal mechanism drives the traverse mechanism 422 to move longitudinally.

In one embodiment, the linear push module 4224 is a screw-nut mechanism, so as to drive the lifting mechanism 421 to move laterally smoothly, precisely and quickly, and then adjust the lateral position of the rotating die frame 411 smoothly, precisely and quickly. It can be understood that the linear push module 4224 can also be a linear module such as a linear motor and a rack and pinion mechanism.

In one embodiment, there are at least two transverse rails 4222 arranged in parallel, each transverse rail 4222 is provided with a transverse slider 4223, and two sides of the linear push module 4224 are respectively provided with transverse rails 4222 to support the lifting support 4215 smoothly and drive the lifting support 4215 to move smoothly.

In one embodiment, referring to FIGS. 14 and 15, the vertical mechanism 423 includes a vertical sliding plate 4234, a vertical slider 4233, a vertical rail 4232, a vertical bracket 4231, and a linear advancing module 4235. The traverse support 4221 is installed on the vertical sliding plate 4234 and supported by the vertical sliding plate 4234. The traverse support 4221 drives the traverse support 4221 to move longitudinally, which further drives the traverse mechanism 422, the lifting mechanism 421 and the die frame rotation mechanism 410 to move longitudinally. The vertical sliding plate 4234 is installed on the vertical slider 4233, and the vertical sliding plate 4234 is supported by the vertical slider 4233. The vertical slider 4233 is installed on the vertical rail 4232, and the vertical rail 4232 supports and guides the vertical slider 4233 to move longitudinally, thereby supporting and guiding the vertical sliding plate 4234 to move longitudinally. The vertical rail 4232 is installed on the vertical bracket 4231, the linear advancing module 4235 is installed on the vertical bracket 4231, the vertical rail 4232 and the linear advancing module 4235 are supported by the vertical bracket 4231, and the linear advancing module 4235 drives the vertical sliding plate 4234 to move longitudinally, which in turn drives the traverse mechanism 422, the lifting mechanism 421 and the die frame rotation mechanism 410 moves longitudinally. The structure can stably support the traverse mechanism 422 and stably drive the traverse mechanism 422, the lifting mechanism 421 and the die frame rotation mechanism 410 to move longitudinally.

In one embodiment, the linear advancing module 4235 is a screw and nut mechanism, so as to drive the longitudinal movement of the traverse mechanism 422 smoothly, precisely and quickly, and then adjust the longitudinal position of the rotating die frame 411 smoothly, precisely and quickly. It can be understood that the linear advancing module 4235 can also be a linear module such as a linear motor and a rack and pinion mechanism.

In one embodiment, there may be a plurality of vertical sliding plates 4234, each vertical sliding plate 4234 corresponds to at least two vertical rails 4232, and each vertical rail 4232 is respectively installed on the vertical slider 4233 to stably support the vertical sliding plate 4234 and then stably support the traverse mechanism 422.

In one embodiment, referring to FIGS. 2, 17-19, the piercing mechanism 500 includes an ejector pin 511, a needle seat 512, a lift pusher 514 and an installation support 515. The ejector pin 511 is installed on the needle seat 512, and the ejector pin 511 is supported by the needle seat 512, so that the ejector pin 511 is installed. The needle seat 512 is connected to the lift pusher 514 to drive the needle seat 512 to move up and down through the lift pusher 514, thereby driving the ejector pin 511 to move up and down. The ejector pin 511 is used to pierce the blue film to push out the die on the blue film, the lift pusher 514 drives the needle seat 512 up and down to drive the ejector pin 511 to move up and down, and then drives the ejector pin 511 to be close to the wafer to pierce the blue film, thereby pushing out the die on the blue film, and separating the ejected die from the blue film, so that the corresponding die can be peeled off from the blue film, so that the suction nozzle 71 can suck it. Stripping does not require a large suction force to protect the die well, and can avoid the problem of die failure, which can improve the die-bonding efficiency when applied to the die-bonding machine 1000. The lift pusher 514 is installed on the installation support 515 to support the lift pusher 514 through the installation support 515, thereby facilitating the installation of components.

In one embodiment, referring to FIG. 16 to FIG. 19, the piercing mechanism 500 further includes a supporting arm 513, a needle seat 512 is installed on the supporting arm 513, the supporting arm 513 is connected to the lift pusher 514, and the needle seat 512 is connected to the lift pusher 514 through the supporting arm 513. The supporting arm 513 is set to support the needle seat 512 and then the ejector pin 511, and the ejector pin 511 can be extended to the designated position through the supporting arm 513, so that the ejector pin 511 can be pushed out and pierced through the blue film to push out the die.

In one embodiment, a plurality of weight reduction through holes 5131 are provided on the supporting arm 513 to reduce the weight of the supporting arm 513 and facilitate the lift pusher 514 to flexibly drive the supporting arm 513 to lift and lower. Understandably, the needle seat 512 can also be directly connected to the lift pusher 514.

In one embodiment, a lifting rail 516 is installed on the installation support 515, the lifting rail 516 is arranged vertically, a slide seat 517 is installed on the lifting rail 516, and the slide seat 517 can move up and down along the lifting rail 516, so that the sliding seat 517 is guided to move up and down by the lifting rail 516. The needle seat 512 is supported on the slide seat 517, and the lift pusher 514 is connected to the slide seat 517. In this way, the lift pusher 514 drives the slide seat 517 to move up and down along the lifting rail 516, thereby driving the needle seat 512 and the ejector pin 511 to move up and down.

In one embodiment, when the supporting arm 513 is provided, the supporting arm 513 is installed on the slide seat 517 to support the supporting arm 513 through the slide seat 517 and smoothly drive the supporting arm 513 to move up and down.

In one embodiment, the lift pusher 514 is a voice coil motor, using a voice coil motor, which is fast, small in size, and easy to control. It can be understood that the lift pusher 514 can also adopt a linear drive mechanism such as a linear motor.

In one embodiment, the piercing mechanism 500 further includes an elastic part 518 for elastically pulling the slide seat 517, one end of the elastic part 518 is connected to the slide seat 517, and the other end of the elastic part 518 is connected to the installation support 515. Arrange the elastic part 518 to cooperate with the lift pusher 514 to pull the slide seat 517 down to flexibly drive the needle seat 512 and ejector pin 511 to move up and down to improve the efficiency of puncturing the blue film and ejecting the die, and then used in the die-bonding machine 1000 can improve the solidification efficiency. In one embodiment, the elastic part 518 is a spring. In some embodiments, the elastic part 518 may also be a cord structure.

In one embodiment, referring to FIG. 16 to FIG. 19, the piercing mechanism 500 further includes a plane moving module 520, the installation support 515 is installed on the plane moving module 520, and the plane moving module 520 is used to adjust the horizontal position of the ejector pin 511, the plane moving module 520 drive the installation support 515 to move parallel to the horizontal plane, and then adjust the position of the ejector pin 511, so that the ejector pin 511 can accurately push out the die at the specified position.

For the convenience of description, define two directions that are perpendicular to each other on the surface perpendicular to the vertical direction, and these two directions are the first direction and the second direction respectively, then the first direction and the second direction are both perpendicular to the vertical direction, and both the first direction and the second direction are parallel to the horizontal direction, and the plane defined by the first direction and the second direction is parallel to the horizontal plane.

In one embodiment, referring to FIG. 16 to FIG. 19, the plane moving module 520 includes a first moving module 521 and a second moving module 522, the installation support 515 is installed on the first moving module 521, and the first moving module 521 is installed on the second moving module 522. The first moving module 521 is used to adjust the position of the ejector pin 511 along the first direction, and the second moving module 522 is used to adjust the position of the ejector pin 511 along the second direction. The first moving module 521 is used to adjust the position of the ejector pin 511 along the first direction, and the second moving module 522 is used to adjust the position of the ejector pin 511 along the second direction. When in use, the second moving module 522 drives the first moving module 521 to move along the second direction to drive the needle seat 512 and the ejector pin 511 to move in the second direction. The first moving module 521 drives the installation support 515 to move in the first direction, so as to drive the needle seat 512 and the ejector pin 511 to move in the first direction, so as to adjust the position of the ejector pin 511 through the cooperation of the first moving module 521 and the second moving module 522.

In one embodiment, the first moving module 521 includes a first sliding seat 5211, a first connecting rod 5212, and a first moving assembly 5214, the installation support 515 is installed on the first sliding seat 5211, and the first sliding seat 5211 is slidably installed on the second moving module 522, so that the first sliding seat 5211 can move at the second moving module 522 is translated along the first direction. The first connecting rod 5212 is connected to the first sliding seat 5211, the first moving assembly 5214 is used to drive the first connecting rod 5212 to move in the first direction, and the installation support 515 is installed on the first sliding seat 5211. Therefore, the first connecting rod 5212 is driven to move in the first direction by the first moving assembly 5214, and then the first sliding seat 5211 is driven to move in the first direction, so as to drive the installation support 515, the lift pusher 514, the ejector pin 511 and the needle seat 512 to move in the first direction. In some embodiments, the first moving module 521 may also directly use a linear drive mechanism such as a screw-nut mechanism, a rack-and-pinion mechanism, and a linear motor.

In one embodiment, the second moving module 522 includes a connecting seat 5221, a second sliding seat 5222, a second connecting rod 5224, and a second moving assembly 5225, the first sliding seat 5211 is slidably installed on the second sliding seat 5222, and the second sliding seat 5222 is slidably installed on the connecting seat 5221 so that the second sliding seat 5222 The connecting seat 5221 can be translated in the second direction. The second connecting rod 5224 is connected to the second sliding seat 5222, the second moving assembly 5225 is used to drive the second connecting rod 5224 to move in the second direction, and the first sliding seat 5211 is installed on the second sliding seat 5222, so that the first sliding seat 5211 can move in the first direction on the second sliding seat 5222. The first moving assembly 5214 is connected to the second sliding seat 5222, and the second moving assembly 5225 drives the second connecting rod 5224 to move in the second direction, which in turn drives the second sliding seat 5222 to move in the second direction to drive the first sliding seat 5211, the first moving assembly 5214, the installation support 515, the lift pusher 514, the ejector pin 511 and the needle seat 512 move in the second direction, the second sliding seat 5222 drives the first moving module 521, the installation support 515, the lift pusher 514, the ejector pin 511 and the needle seat 512 to move in the second direction. In some embodiments, the second moving module 522 may also directly use a linear drive mechanism such as a screw-nut mechanism, a rack-and-pinion mechanism, and a linear motor.

In one embodiment, the first sliding seat 5211 is slidably installed on the second sliding seat 5222 through the first guide rail 5213, so that the first sliding seat 5211 can move flexibly on the second sliding seat 5222. In one embodiment, the second sliding seat 5222 is slidably installed on the connecting seat 5221 through the second guide rail 5223, so that the second sliding seat 5222 can move flexibly on the connecting seat 5221.

In one embodiment, a first vertical groove 52121 is formed on the first connecting rod 5212, and the first moving assembly 5214 includes a first eccentric wheel 52142 and a first driving motor 52141. The first eccentric wheel 52142 is installed on the first driving motor 52141, and the first eccentric wheel 52142 is matched and placed in the first vertical groove 52121, so that when the first driving motor 52141 drives the first eccentric wheel 52142 to rotate, it can push the side wall of the first vertical groove 52121 to reciprocate in the first direction, and then drive the first connecting rod 5212 to reciprocate in the first direction, and control the rotation angle of the first eccentric wheel 52142 by the first driving motor 52141, which can adjust the moving position of the first connecting rod 5212, and then adjust the installation support 515, the lift pusher 514, the needle seat 512 and the ejector pin 511 to move position along the first direction.

The first driving motor 52141 is connected to the second sliding seat 5222 so as to support the first driving motor 52141 and allow the first driving motor 52141 to move with the second sliding seat 5222. In addition, use the first eccentric wheel 52142 to drive the first connecting rod 5212 to move, with fast speed and high efficiency, so as to adjust the position of the ejector pin 511 faster and improve the efficiency. It can be understood that the first moving assembly 5214 can also use a linear driving mechanism such as a linear motor to drive the first connecting rod 5212 to move in the first direction.

In one embodiment, a second vertical groove 52241 is formed on the second connecting rod 5224, and the second moving assembly 5225 includes a second eccentric wheel 52252 and a second driving motor 52251. The second eccentric wheel 52252 is installed on the second driving motor 52251, and the second eccentric wheel 52252 is matched and placed in the second vertical groove 52241, so that when the second driving motor 52251 drives the second eccentric wheel 52252 to rotate and push the side wall of the second vertical groove 52241 to reciprocate in the second direction, and then drive the second connecting rod 5224 to reciprocate in the second direction, and control the rotation angle of the second eccentric wheel 52252 by the second driving motor 52251, which can adjust the moving position of the second connecting rod 5224, and then adjust the first moving module 521, the installation support 515, the lift pusher 514, the needle seat 512 and the ejector pin 511 to move position in the second direction. The second driving motor 52251 is connected to the connecting seat 5221 to support the second driving motor 52251. In addition, use the second eccentric wheel 52252 to drive the second connecting rod 5224 to move, with fast speed and high efficiency, so as to adjust the position of the ejector pin 511 faster and improve the efficiency. It can be understood that the second moving assembly 5225 can also use a linear driving mechanism such as a linear motor to drive the second connecting rod 5224 to move in the second direction.

In one embodiment, referring to FIG. 16 to FIG. 19, the piercing mechanism 500 further includes a lifting module 530, the lifting module 530 is used to adjust the height position of the ejector pin 511, and the plane moving module 520 is installed on the lifting module 530. Therefore, the lifting module 530 drives the plane moving module 520 to move up and down, and then drives the installation support 515, the lift pusher 514, the ejector pin 511 and the needle seat 512 to move up and down, so that the height of the ejector pin 511 can be adjusted. Using the lifting module 530, the position of the ejector pin 511 can be adjusted within a large height range, so as to facilitate the installation and use of the piercing mechanism 500.

In one embodiment, the lifting module 530 includes an installation seat 532, an adjusting seat 531 slidably installed on the installation seat 532, and a linear driver 533 for driving the adjusting seat 531 to move up and down. The plane moving module 520 is installed on the adjusting seat 531, the linear driver 533 is installed on the installation seat 532, and the adjusting seat 531 is connected to the linear driver 533 to drive the adjusting seat 531 to rise and fall through the linear driver 533 to adjust the height of the plane moving module 520 and then adjust the height of the ejector pin 511.

In one embodiment, the linear driver 533 may be a lead screw nut mechanism. Of course, the linear driver 533 can also use linear motors, rack and pinion mechanisms, and so on.

Figure 24:
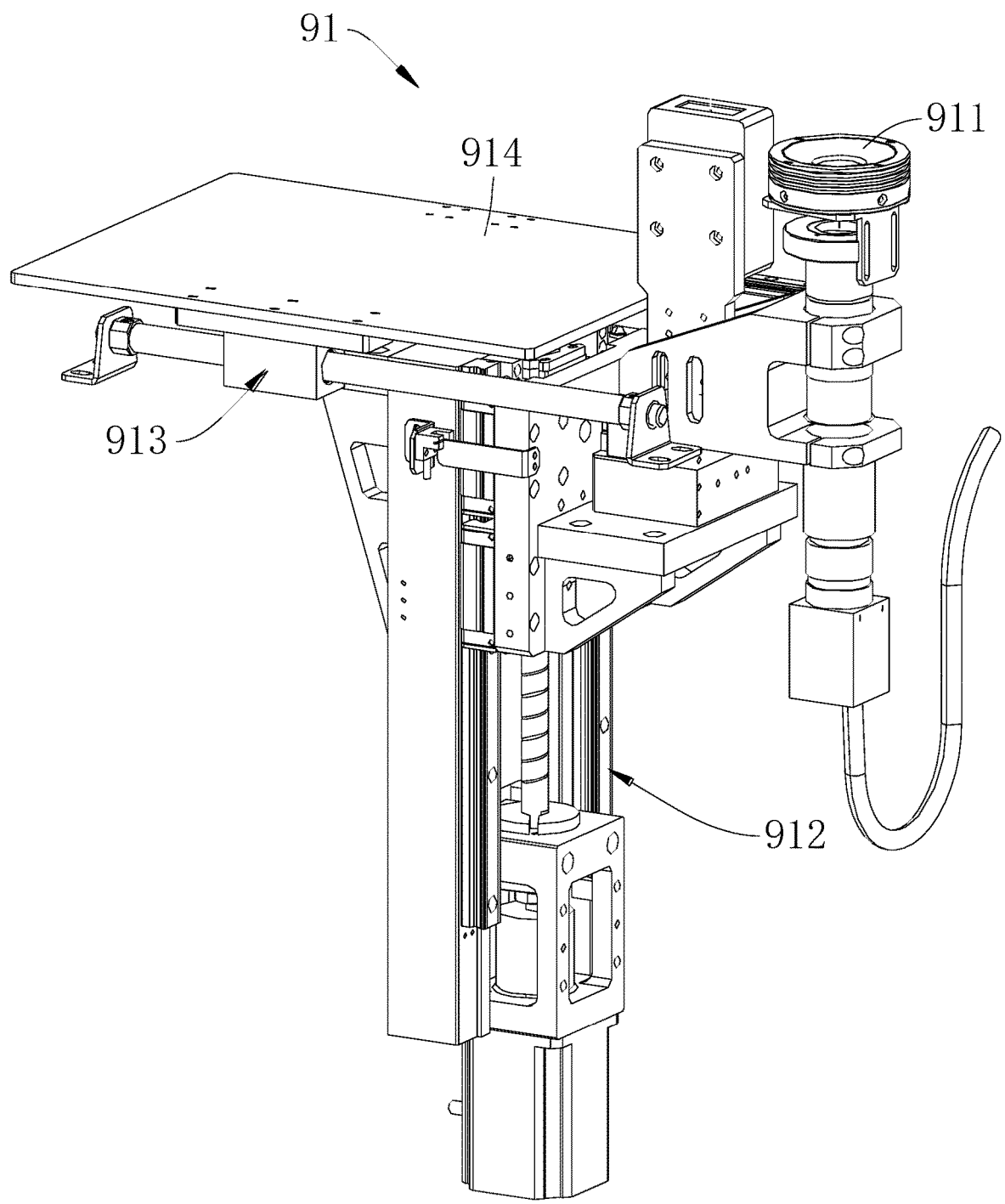
FIG. 24 is a schematic structural diagram of a plane moving module provided by an embodiment of the present application.

In one embodiment, referring to FIG. 2 and FIG. 24, the die-bonding machine 1000 further includes a die supply camera unit 91, the die supply camera unit 91 is installed below the die supply position, and the die supply camera unit 91 is used to capture the die image of the die supply position, so that before the piercing mechanism 500 ejects the die, the rotary drive module 413 can drive the die ring 97 to rotate, so as to drive the die to rotate, and adjust the angle of the die, so that the turret mechanism 600 can take dies accurately.

In one embodiment, the die supply camera unit 91 includes a die supply camera module 911 and a lift driver 912, the die supply camera module 911 is installed on the lift driver 912, and the die supply camera module 911 is driven up and down by the lift driver 912, so that the die supply camera unit 91 can accurately capture the die supply position die image. In addition, the die supply camera unit 91 can also be prevented from blocking the movement of the turn turret arm 621 of the turret mechanism 600.

In one embodiment, the die supply camera unit 91 further includes a vertical shift adjuster 913; and a vertical shift support plate 914, the vertical shift adjuster 913 is connected to the vertical shift support plate 914, and the vertical shift support plate 914 supports the vertical shift adjuster; the lift driver 912 is connected to the vertical shift adjuster 913 to adjust the longitudinal position of the die supply camera module 911.

In one embodiment, the lift driver 912 is a lead screw nut mechanism. It can be understood that the lift driver 912 can also be a linear module such as a linear motor and a rack and pinion structure.

In one embodiment, the vertical shift adjuster 913 is a cylinder. It can be understood that the vertical shift adjuster 913 can also be a linear module such as a linear motor and a rack and pinion structure.

Figure 20:
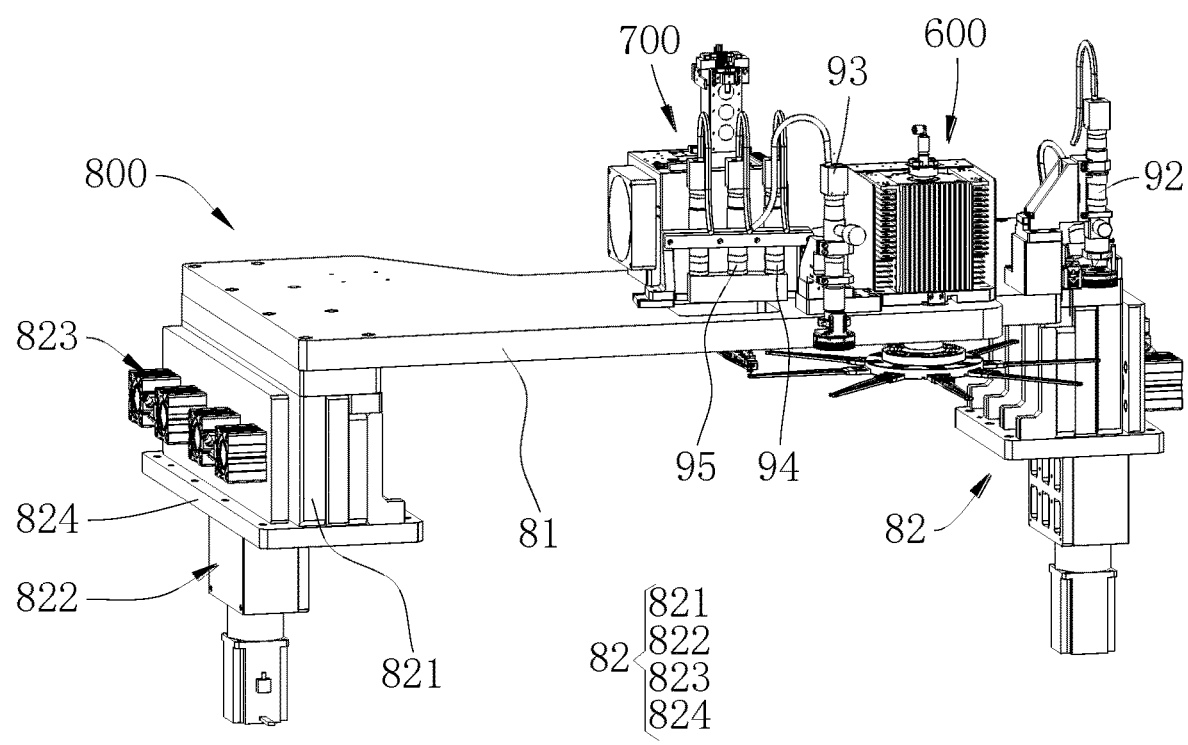
FIG. 20 is a schematic structural diagram of the die-bonding mechanism and the turret mechanism installed on the frame in FIG. 2.

In one embodiment, referring to FIG. 2 and FIG. 20, the die-bonding machine 1000 further includes a frame 800, the die-bonding mechanism 700 and the turtle mechanism 600 are installed on the frame 800, the frame 800 is installed on the stand 900, and the die-bonding mechanism 700 and the turret mechanism 600 are supported by the frame 800.

In one embodiment, referring to FIG. 20, the frame 800 includes an installation plate 81 and two sets of adjustment mechanisms 82, which are respectively installed on both ends of the installation plate 81 to support the installation plate 81 through the two sets of adjustment mechanisms 82. The die-bonding bracket 75 is installed on the installation plate 81 to mount the die-bonding mechanism 700 on the frame 800. The transfer module 62 is installed on the installation plate 81. For example, the positioning bracket 625 of the transfer module 62 is installed on the installation plate 81. Two sets of adjustment mechanisms 82 are used to coordinately adjust the position of the installation plate 81 on the vertical plane, thereby adjusting the height and lateral positions of the die-bonding mechanism 700 and the turtle mechanism 600.

In one embodiment, referring to FIG. 20, each adjustment mechanism 82 includes a sliding plate 821, a lifting driver 822, a reverse pusher 823 and a supporting frame 824, and the reverse pusher 823 is installed on the supporting frame 824 to support the reverse pusher 823 through the supporting frame 824. The supporting frame 824 is installed on the stand 900, and the sliding plate 821 is connected to the installation plate 81 to support the installation plate 81 through the sliding plate 821. The lifting driver 822 is connected to the sliding plate 821, and the sliding plate 821 is pushed up and down by the lifting driver 822 to adjust the height of the installation plate 81. The transverse pusher 823 is used to drive the sliding plate 821 to move laterally to drive the installation plate 81 to move laterally to facilitate debugging and running.

In one embodiment, the lifting driver 822 can be a screw-nut mechanism to smoothly support and drive the sliding plate 821 to drive the installation plate 81 to move up and down. Of course, the lifting driver 822 can also use linear modules such as rack and pinion.

In one embodiment, the reverse pusher 823 of the two sets of adjustment mechanism 82 can be equipped with an air cylinder, and the two sets of the reverse pusher 823 of the adjustment mechanism 82 are respectively installed on the side of each supporting frame 824 away from the other supporting frame 824, so that the two sets of the reverse pusher 823 of the adjustment mechanism 82 can cooperate to adjust the position of the sliding plate 821 in the lateral direction, and then adjust the position of the installation plate 81 moving laterally.

Figure 23:
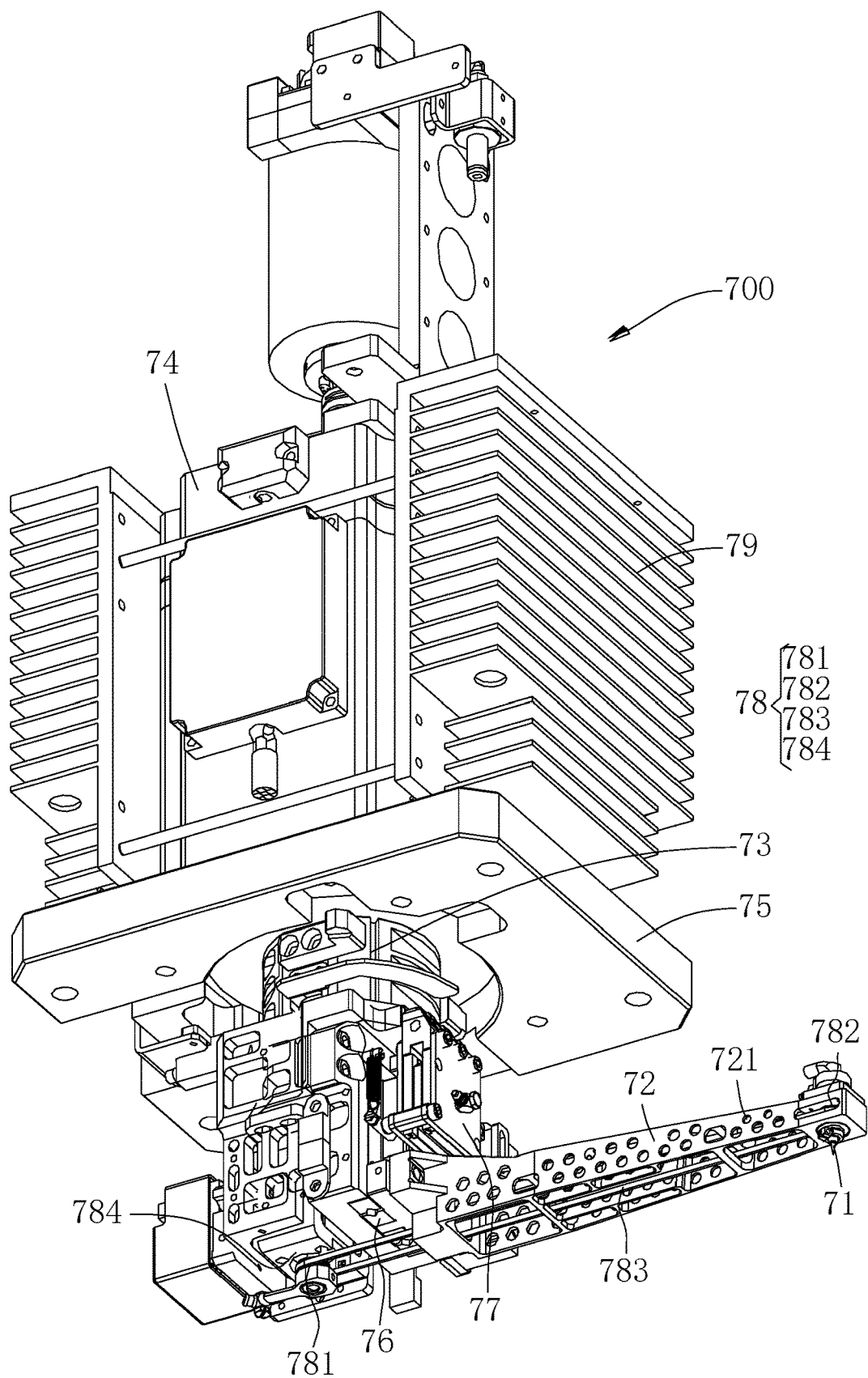
FIG. 23 is a schematic structural diagram of a die-bonding mechanism provided by an embodiment of the present application.

In one embodiment, referring to FIGS. 20 and 23, a die-bonding mechanism 700 includes a suction nozzle 71, a die-bonding swing arm 72, a rotating seat 73, a die-bonding motor 74 and a die-bonding bracket 75. The suction nozzle 71 is used to suck the die. The suction nozzle 71 is installed on the die-bonding swing arm 72, and the suction nozzle 71 is supported by the die-bonding swing arm 72. The die-bonding swing arm 72 is installed on the rotating seat 73, and the die-bonding swing arm 72 is supported by the rotating seat 73. The rotating seat 73 is connected to a die-bonding motor 74, the die-bonding motor 74 is installed on the die-bonding bracket 75, and the die-bonding bracket 75 is installed on the frame 800 to mount the die-bonding mechanism 700 on the frame 800. When working, the die-bonding motor 74 drives the rotating seat 73 to rotate, so as to drive the die-bonding swing arm 72 to rotate, which in turn drives the suction nozzle 71 on the die-bonding swing arm 72 to move. When the suction nozzle 71 moves to the die extraction position, the die is sucked, and then the die-bonding swing arm 72 drives the suction nozzle 71 and the die to move to the bonding position to mount the die on the substrate.

In one embodiment, referring to FIGS. 20 and 23, a vertical rail 76 is installed on the rotating seat 73, a die-bonding swing arm 72 is slidably installed on the vertical rail 76, a lifting pusher 77 is installed on the rotating seat 73, the lifting pusher 77 and the die-bonding swing arm 72 are installed on the rotating seat 73 connected to drive the die-bonding swing arm 72 to move up and down through the lifting pusher 77.

In one embodiment, the lifting pusher 77 is a voice coil motor, which has fast moving speed and high die bonding efficiency, and has a certain elastic buffer to prevent the suction nozzle 71 from crushing the die when the die-bonding swing arm 72 is driven to move up and down. It can be understood that the lifting pusher 77 can also use linear modules such as air cylinders and linear motors.

In one embodiment, the die-bonding swing arm 72 is provided with a number of weight reduction openings 721 to reduce the weight of the die-bonding swing arm 72 and facilitate driving the die-bonding swing arm 72 to swing smoothly.

In one embodiment, the die-bonding mechanism 700 further includes an adjustment component 78. The adjustment component 78 includes a driven pulley 782, a driving pulley 781, a synchronous belt 783, and a rotating motor 784. The rotating motor 784 is installed on the rotating seat 73. The synchronous belt 783 connects the driven pulley 782 and the driving pulley 781, and the driven pulley 782 is connected to the suction nozzle 71, the suction nozzle 71 is rotatably installed on the die-bonding swing arm 72, the driving pulley 781 is connected to the rotating motor 784, the driving pulley 781 is driven to rotate by the rotating motor 784, and the driven pulley 782 is driven to rotate by the synchronous belt 783, which in turn drives the suction nozzle 71 to rotate, so as to adjust the angle of sucking die on the suction nozzle 71, which facilitates precise die bonding.

In one embodiment, a radiator member 79 is installed on the die-bonding motor 74 to dissipate heat from the die-bonding motor 74 so that the die-bonding motor 74 runs smoothly.

Figure 21:
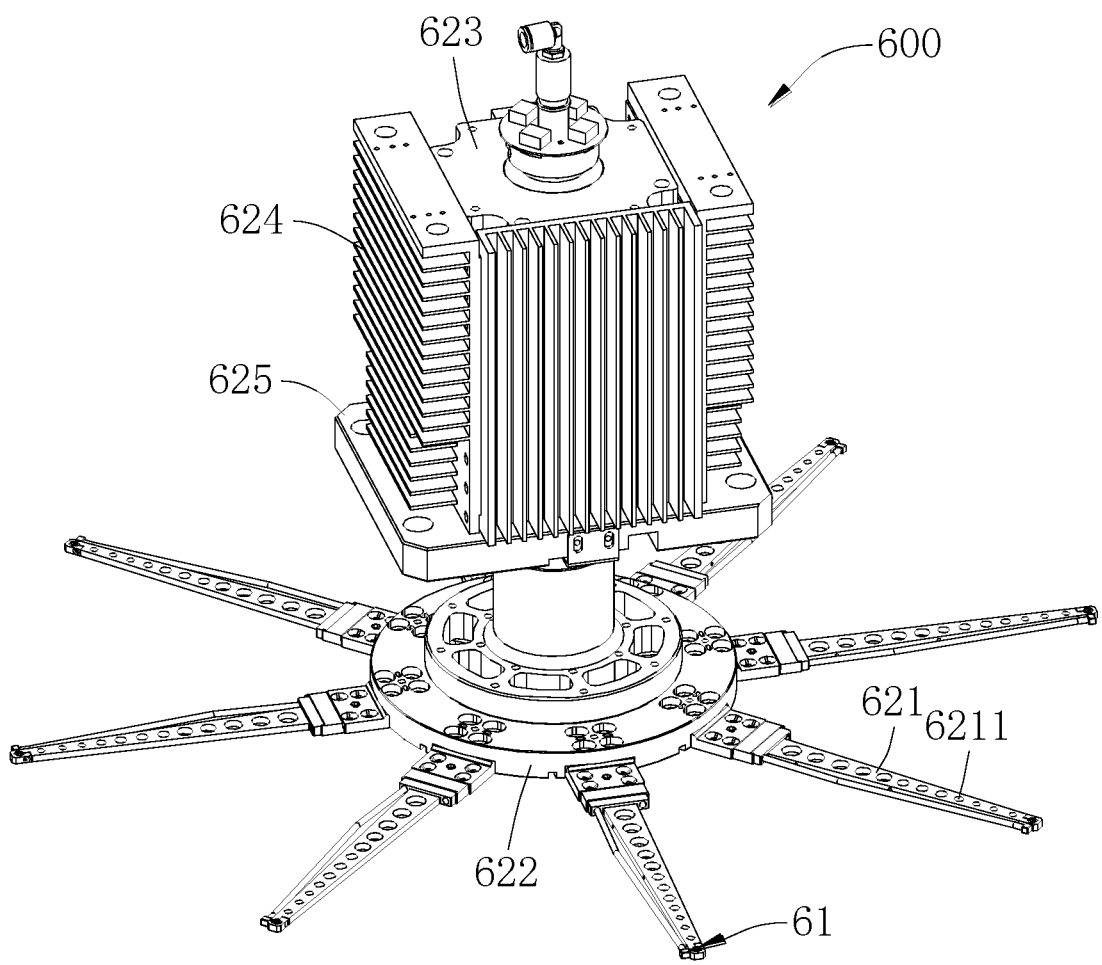
FIG. 21 is a schematic structural diagram of the turret mechanism in FIG. 20.
Figure 22:
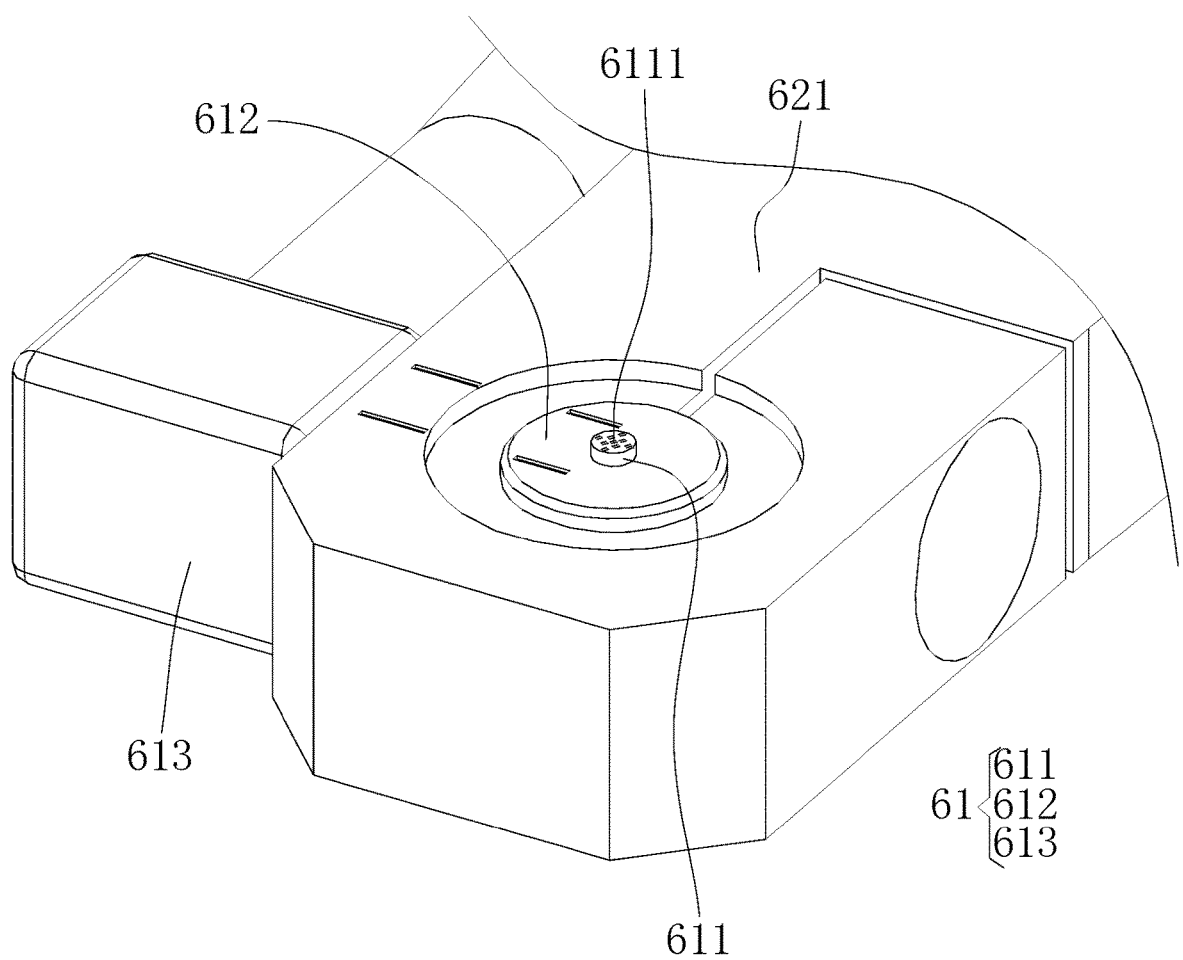
FIG. 22 is the structural representation of the die holder part in FIG. 21.

In one embodiment, referring to FIGS. 20, 21 and 22, the turtle mechanism 600 includes a die holder 61 and a transfer module 62, the die holder 61 is used to support the die, the die holder 61 receives and supports the die to drive the die to move. The die holder 61 is connected to the transfer module 62, and the transfer module 62 drives the die holder 61 to move, so that the die holder 61 moves to the die supply position, receives the die from the die supply position, and then the transfer module 62 drives the die holder 61 and the die to move to the die extraction position, so that the die-suction nozzle 71 on the bonding swing arm 72 sucks the die on the die holder 61. The transfer module 62 is installed on the frame 800 to support the transfer module 62 through the frame 800, thereby supporting the turret mechanism 600 on the frame 800.

Since the transfer module 62 is used to drive the die holder 61 to move the die holder 61 to the die supply position to receive the die supplied by the die supply position, and then drive the die holder 61 to move to the die extraction position to transfer the die to the die extraction position, so that the die-suction nozzle 71 on the bonding swing arm 72 can directly suck the die from the die extraction position, and then move to the bonding position to install the die. In this way, the distance between the die extraction position and the bonding position can be arranged to be small, so that the length of the die-bonding swing arm 72 can be arranged to be smaller, the vibration when the die-bonding swing arm 72 is rotated can be reduced, and the stability of the rotation of the die-bonding swing arm 72 can be improved. In addition, the moving stroke of the suction nozzle 71 can be shortened, the stability of the movement of the suction nozzle 71 can be further improved, the vibration of the suction nozzle 71 can be reduced, and the die-bonding precision and die-bonding efficiency can be improved.

In one embodiment, referring to FIGS. 21 and 22, the die holder 61 includes a suction head 611, a suction seat 612 and a suction connector 613, wherein the suction head 611 is used to attract the die to support the die, and the die can be positioned for easy movement die. The suction head 611 is installed on the suction seat 612, and the suction head 611 is supported by the suction seat 612. The suction connector 613 is connected to the suction seat 612, and the suction connector 613 is connected to the suction head 611, so that the suction head 611 can be conveniently connected to an external suction device, so as to generate a negative pressure at the suction head 611 to suck the die. The seat suction 612 is installed on the transfer module 62 to install the suction head 611 on the transfer module 62. It can be understood that the die holder 61 can also use a block seat with a mounting groove, so as to place the die in the mounting groove and support the die through the block seat.

In one embodiment, the suction head 611 is provided with a plurality of suction holes 6111 to better suck the die and position the die. In addition, by arranging multiple suction holes 6111, each suction hole 6111 can be made smaller to match the suction of the die, so as to prevent the die from falling into the suction hole 6111, and can suck the dies with smaller size. A plurality of suction holes 6111 can cover a larger area, so that dies of different sizes can be sucked.

In one embodiment, the transfer module 62 includes a turn turret arm 621, a rotating base 622, a rotary driver 623 and a positioning bracket 625, and the die holder 61 is installed on the turn turret arm 621 to support the die holder 61 through the turn turret arm 621. The turn turret arm 621 is installed on the rotating base 622 to support the turn turret arm 621 through the rotating base 622. The rotating base 622 is connected to the rotary driver 623, so that the rotating base 622 is driven to rotate by the rotary driver 623, which in turn drives the turn turret arm 621 to rotate, and then drives the die holder 61 to rotate. The rotary driver 623 is installed on the positioning bracket 625, and the rotary driver 623 is supported by the positioning bracket 625. Positioning bracket 625 is installed on frame 800 to mount transfer module 62 on positioning bracket 625.

In one embodiment, when the die holder 61 includes a suction seat 612, the suction seat 612 is installed on the turn turret arm 621 to mount the suction head 611 on the turn turret arm 621.

In one embodiment, the rotary driver 623 may be a motor, and the rotating base 622 is driven to rotate by the motor. It can be understood that the rotary driver 623 can also use driving elements such as rotary cylinders.

In one embodiment, a radiator 624 is installed on the rotary driver 623, so as to dissipate heat to the rotary driver 623 to ensure stable operation of the rotary driver 623, and then stably drive the rotating base 622 to rotate.

In one embodiment, a plurality of turn turret arms 621 are installed on the rotating base 622, and a die holder 61 is installed on each of the turn turret arms 621 respectively. Arrange a plurality of turn turret arms 621, and install the die holders 61 on each turn turret arm 621 respectively, so that a plurality of die holders 61 can pass through the die supply position to the die extraction position in turn, and keep the plurality of die holders 61 between the die supply position and the die extraction position, which can improve the efficiency of die transfer, so that the die-bonding mechanism 700 can suck the die in time and improve the die bonding efficiency. In addition, the stroke and time of each movement of the die on the die holder 61 and the die holder 61 can be reduced, and the vibration during the movement of the die can be reduced, so as to move the die more stably and supply the die more accurately, thereby improving the die bonding efficiency.

In one embodiment, a plurality of turn turret arms 621 are evenly distributed on the peripheral side of the rotating base 622, so that each turn turret arm 621 rotates at the same angle each time, which is convenient for controlling and driving each turn turret arm 621 to rotate smoothly.

In one embodiment, a plurality of weight reduction holes 6211 are provided on the turn turret arm 621 to reduce the weight of the turn turret arm 621 and facilitate the rotary driver 623 to drive the turn turret arm 621 to rotate.

In one embodiment, the number of turn turret arms 621 is eight, and in other embodiments, the number of turn turret arms 621 may be six, seven, nine, ten, and so on.

In one embodiment, referring to FIG. 20, the die-bonding machine 1000 further includes a die extraction camera module 92, the die extraction camera module 92 is arranged above the die supply position, and the die extraction camera module 92 is installed on the frame 800. The die extraction camera module 92 is used to capture the die image at the die supply position, so that the die holder 61 of the turtle mechanism 600 can receive the die accurately, which improves the efficiency and accuracy of the die holder 61 in the die supply position.

In one embodiment, referring to FIG. 20, the die-bonding machine 1000 further includes a transfer camera module 93, the transfer camera module 93 is arranged above the die holder 61, the transfer camera module 93 is located between the die supply position and the die extraction position, and the transfer camera module 93 is installed on the frame 800. The transfer camera module 93 is used to capture the die image on the die holder 61. By arranging the transfer camera module 93 between the die supply position and the die extraction position, before the die reaches the die extraction position, the transfer camera module 93 captures the die image on the die holder 61 to determine the angle and position of the die, so that after the suction nozzle 71 sucks the die, the suction nozzle 71 can adjust the angle of the die on the suction nozzle 71 in time to improve the accuracy of die taking, which is also convenient for subsequent die bonding operations, and improves the efficiency and accuracy of die bonding.

In one embodiment, referring to FIG. 20, the die-bonding machine 1000 further includes a die camera module 94, the die camera module 94 is arranged above the bonding position, and the die camera module 94 is installed on the frame 800. The die camera module 94 is used to capture the image of the bonding position for precise die bonding and improve the precision and efficiency of die bonding.

In one embodiment, referring to FIG. 20, the die-bonding machine 1000 further includes a detection camera module 95, the detection camera module 95 is arranged at a position directly above the bonding position, and the detection camera module 95 is installed on the frame 800. The detection camera module 95 is used to capture the die image installed on the substrate to detect the die bonding effect and ensure the die bonding quality.

In one embodiment, there may be multiple detection camera modules 95, and the effect of installing the die on the substrate is detected by multiple detection camera modules 95, so as to ensure the quality of die bonding and facilitate subsequent repair.

In one embodiment, the die-bonding machine 1000 includes a die extraction camera module 92, a transfer camera module 93, a die camera module 94 and a detection camera module 95, so that the die can be positioned before the suction head 611 of the turtle mechanism 600 sucks the die to ensure that the suction head 611 sucks the die in the process of die transfer, take a picture of the die, so that the suction nozzle 71 of the die-bonding mechanism 700 can accurately pick up and adjust the die angle, take a picture at the die extraction position to ensure that the suction nozzle 71 can pick up the die accurately, and then, take images at the bonding position to ensure the accuracy of die bonding, and finally, check the quality of die bonding to ensure the effect of die bonding.

The above descriptions are only optional embodiments of the present application, and are not intended to limit the present application. Any modifications, equivalent replacements and improvements made within the spirit and principles of the present application shall be within the protection scope of the present application.

What is claimed is:

1. A die-bonding machine, comprising:
   a transferring unit, used to support and transfer a substrate to a bonding position;
   a feeding unit, used to position and supply the substrate to the transferring unit;
   a die supply unit, used to support a die ring and supply dies to a die supply position;
   a die ring supply unit, used to supply full die rings to the die supply unit and recover empty die rings in the die supply unit;
   a turret mechanism, configured for transferring the dies in the die supply position to a die extraction position;
   a piercing mechanism, configured for downwardly piercing a blue film of a die on the die supply position to push the die to the turret mechanism; and,
   a die-bonding mechanism, configured for sucking the die from the die extraction position and moving the die to the bonding position to be installed on the substrate;
   wherein the turret mechanism is arranged between the piercing mechanism and the die-bonding mechanism, the piercing mechanism is arranged on one side of the die supply unit, the transferring unit is arranged on one side of the feeding unit, the feeding unit is located underneath the die-bonding mechanism;
   wherein the transferring unit comprises a splint mechanism for supporting and clamping the substrate and a plane movement platform for driving the splint mechanism to move on a plane; and
   the splint mechanism comprises:
   a support base plate, installed on the plane movement platform;
   two sets of roller assemblies installed on opposite sides of the support base plate respectively, and used to cooperate with the opposite sides of the substrate; and,
   two sets of clamping assemblies installed on opposite sides of the support base plate respectively, and used to press and fix the opposite sides of the substrate on corresponding roller assemblies, so that each clamping assembly and corresponding roller assembly cooperates to clamp and fix side edges of the substrate; and
   wherein the two sets of roller assemblies comprise a roller support supported on the support base plate; a plurality of roller seats are arranged on the roller support; a plurality of the roller seats are arranged at intervals along a length direction of the roller supports; and rollers are rotatably installed on each of the roller seats.

2. The die-bonding machine of claim 1, wherein the die ring supply unit comprises:
   a feeding mechanism, used to support a die ring box and drive the die ring box to move up and down;
   a delivery platform, configured for supporting and driving the die ring to move, the delivery platform having at least two accommodating slots for storing the die ring;
   a reclaiming mechanism, configured for taking full die rings in the die ring box and placing the full die rings to the delivery platform, and transferring empty die rings in the delivery platform to the die ring box; and,
   a delivery mechanism, configured for transferring empty die rings of the die supply position to the delivery platform, and transferring the full die rings on the delivery platform to the die supply position;

wherein the feeding mechanism and the reclaiming mechanism are respectively arranged on opposite sides of the delivery platform, and the delivery platform is arranged below the delivery mechanism.

3. The die-bonding machine of claim 2, wherein the delivery platform comprises: a tray, and a linear driving module, configured for driving the tray to and from the reclaiming mechanism and the delivery mechanism; and each of the two accommodating slots is arranged on the tray.

4. The die-bonding machine of claim 2, wherein the delivery mechanism comprises:
  a grab assembly, configured for grabbing the die ring,
  a connecting frame, configured for supporting the grab assembly,
  a lifting seat, configured for supporting the connecting frame,
  a lift drive module, configured for driving the lifting seat to move up and down,
  a mounting slide, configured for supporting the lift drive module,
  a linear travel module, configured for driving the mounting slide to and from the die supply position and the delivery platform, and
  a travel support, configured for supporting the linear travel module.

5. The die-bonding machine according to claim 1, wherein
  the die supply unit comprises:
  a die frame rotation mechanism, configured for supporting the die ring and driving the die ring to rotate, and
  a moving platform, configured for adjusting a spatial position of the die frame rotation mechanism; and
  the die frame rotation mechanism comprises:
  a supporting plate, arranged on the side of the moving platform, and the supporting plate connected to the moving platform;
  a rotating die frame, configured for supporting the die ring, and installed on the supporting plate; and,
  a rotary drive module for driving the rotating die frame to rotate;
  wherein the rotary drive module is installed on the supporting plate, and the rotary drive module is located on a side of a rotary die frame close to the moving platform, and the supporting plate is defined with an opening exposing hollow position of the rotary die frame.

6. The die-bonding machine according to claim 1, wherein the piercing mechanism comprises:
  an ejector pin for piercing the blue film to eject the die on the blue film;
  a needle seat for supporting the ejector pin;
  a lift pusher, used to drive the needle seat to move up and down, so as to drive the ejector pin to go up and down; and
  an installation support;
  wherein the lift pusher is installed on the installation support.

7. The die-bonding machine according to claim 1, wherein the turret mechanism comprises:
  a die holder, configured for supporting the die; and,
  a transfer module, configured for driving the die holder to receive the die from the die supply position and transfer the die to the die extraction position, and the transfer module being arranged between the die-bonding mechanism and the piercing mechanism.

8. The die-bonding machine according to claim 7, wherein the transfer module comprises a turret arm, a rotating base supporting the turret arm, a rotary driver driving the rotating base to rotate, and a positioning bracket supporting the rotary driver; and the die holder is installed on the turret arm.

\* \* \* \* \*